US012772607B2

(12) United States Patent
Park et al.

(10) Patent No.: US 12,772,607 B2
(45) Date of Patent: Oct. 20, 2026

(54) LIGHT EMITTING DEVICE AND DISPLAY APPARATUS INCLUDING THE SAME

(71) Applicant: SAMSUNG DISPLAY CO., LTD., Yongin-si (KR)

(72) Inventors: Younghwan Park, Suwon-si (KR); Joosung Kim, Suwon-si (KR); Dongchul Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 18/230,858

(22) Filed: Aug. 7, 2023

(65) Prior Publication Data

US 2024/0234622 A1 Jul. 11, 2024

(30) Foreign Application Priority Data

Jan. 5, 2023 (KR) ........................ 10-2023-0001917

(51) Int. Cl.
*H10H 20/813* (2025.01)
*H10H 20/81* (2025.01)
(Continued)

(52) U.S. Cl.
CPC ........ *H10H 20/8131* (2025.01); *H10H 20/81* (2025.01); *H10H 20/813* (2025.01); *H10H 20/8252* (2025.01); *H10H 20/8314* (2025.01); *H10H 20/857* (2025.01); *H10H 29/962* (2025.01)

(58) Field of Classification Search
None
See application file for complete search history.

(56) References Cited

U.S. PATENT DOCUMENTS 6,538,265 B1 * 3/2003 Sugawara ........ H10H 20/01335 257/94
11,081,622 B2 8/2021 Wildeson et al.
(Continued)

OTHER PUBLICATIONS

Soichiro Morikawa et al., "Pulsed Sputtering Preparation of InGaN Multi-Color Cascaded LED Stacks for Large-Area Monolithic Integration of RGB LED Pixels", Crystals, vol. 12, No. 4, Article No. 499, Apr. 4, 2022, 8 Pages, DOI: 10.3390/cryst12040499.
(Continued)

*Primary Examiner* — Feifei Yeung Lopez
(74) *Attorney, Agent, or Firm* — Sughrue Mion, PLLC

(57) ABSTRACT

The present disclosure provides light emitting devices and display apparatuses including the same. In some embodiments, a light emitting device includes a first light emitting element configured to emit light of a first wavelength, a PN junction layer provided on the first light emitting element, and a second light emitting element provided on the PN junction layer and configured to emit light of a second wavelength different from the first wavelength. The PN junction layer includes a first conductivity type semiconductor layer provided on the first light emitting element and doped with impurities of a first conductivity type, and a second conductivity type semiconductor layer provided on the first conductivity type semiconductor layer and doped with impurities of a second conductivity type electrically opposite to the first conductivity type.

16 Claims, 14 Drawing Sheets

(51) Int. Cl.

| | |
|---|---|
| ***H10H 20/825*** | (2025.01) |
| ***H10H 20/831*** | (2025.01) |
| ***H10H 20/857*** | (2025.01) |
| ***H10H 29/80*** | (2025.01) |

(56) References Cited

U.S. PATENT DOCUMENTS

| | | | | |
|---|---|---|---|---|
| 2005/0067627 | A1* | 3/2005 | Shen | H10H 20/813 257/89 |
| 2007/0170444 | A1 | 7/2007 | Cao | |
| 2009/0078955 | A1* | 3/2009 | Fan | H10H 29/10 438/46 |
| 2014/0110664 | A1* | 4/2014 | Lo | H10H 20/812 257/14 |
| 2015/0206472 | A1* | 7/2015 | Chae | G09G 3/3666 345/89 |
| 2020/0402964 | A1 | 12/2020 | Kim | |
| 2021/0184076 | A1 | 6/2021 | Kim et al. | |
| 2021/0234063 | A1* | 7/2021 | Maros | H10H 20/812 |
| 2021/0296528 | A1 | 9/2021 | Fujiwara et al. | |
| 2022/0285578 | A1 | 9/2022 | Kim et al. | |
| 2023/0420627 | A1* | 12/2023 | Armitage | H10H 20/01 |

OTHER PUBLICATIONS

Panpan Li et al., "Fully transparent metal organic chemical vapor deposition-grown cascaded InGaN micro-light-emitting diodes with independent junction control", Optics Express, vol. 29, No. 14, Jul. 5, 2021, Pp. 22001-22007, DOI: 10.1364/OE.430694.

Communication issued on Mar. 20, 2024 by the European Patent Office for European Patent Application No. 23197424.7.

* cited by examiner

LIGHT EMITTING DEVICE AND DISPLAY APPARATUS INCLUDING THE SAME

CROSS-REFERENCE TO RELATED APPLICATION

This application is based on and claims priority under 35 U.S.C. § 119 to Korean Patent Application No. 10-2023-0001917, filed on Jan. 5, 2023, in the Korean Intellectual Property Office, the disclosure of which is incorporated by reference herein in its entirety.

BACKGROUND

1. Field

The present disclosure relates generally to light emitting devices, and more particularly, to a monolithic light emitting device and a display apparatus including the same.

2. Description of the Related Art

Light emitting diodes (LEDs) may be considered as next-generation light sources due to advantages such as long life, low power consumption, fast response speed, and environmental friendliness compared to related light sources. Thus, industrial demand for LEDs may be increasing due to these advantages over the related light sources. Typically, LEDs may be applied to and/or may be used in various products such as, but not limited to, lighting devices and backlights of display apparatuses. Recently, micro- or nano-scale micro-LEDs using group II-VI and/or group III-V compound semiconductors have been developed.

In addition, a micro-LED display apparatus in which such micro-LEDs are directly applied as light emitting elements of display pixels has been developed. However, a transcription technology to manufacture a large number of red LED chips, green LED chips, and blue LED chips and arrange the LED chips at appropriate locations on a display substrate may be difficult.

SUMMARY

Aspects to the present disclosure provide for a monolithic light emitting device having an epitaxial structure in which a plurality of light emitting elements emitting light of different wavelengths are vertically stacked, and a display apparatus including the monolithic light emitting device.

According to an aspect of the present disclosure, a light emitting device is provided. The light emitting device includes a first light emitting element configured to emit light of a first wavelength, a PN junction layer provided on the first light emitting element, and a second light emitting element provided on the PN junction layer and configured to emit light of a second wavelength different from the first wavelength. The PN junction layer includes a first conductivity type semiconductor layer provided on the first light emitting element and doped with impurities of a first conductivity type, and a second conductivity type semiconductor layer provided on the first conductivity type semiconductor layer and doped with impurities of a second conductivity type electrically opposite to the first conductivity type.

In some embodiments, in the light emitting device, each of a first thickness of the first conductivity type semiconductor layer and a second thickness of the second conductivity type semiconductor layer may be about 1 nanometer (nm) or more and about 1 micrometer (μm) or less.

In some embodiments, in the light emitting device, each of doping concentrations of the first conductivity type semiconductor layer and the second conductivity type semiconductor layer may range from $10^{16}/cm^3$ to $10^{20}/cm^3$.

In some embodiments, the first light emitting element may include a first semiconductor layer, a second semiconductor layer, and an active layer provided between the first semiconductor layer and the second semiconductor layer. In such embodiments, the first conductivity type semiconductor layer may be provided on an upper surface of the second semiconductor layer of the first light emitting element.

In some embodiments, the first semiconductor layer of the first light emitting element may be doped with impurities of the first conductivity type, and the second semiconductor layer of the first light emitting element may be doped with impurities of the second conductivity type.

In some embodiments, the second light emitting element may include a first semiconductor layer, a second semiconductor layer, and an active layer provided between the first semiconductor layer and the second semiconductor layer. In such embodiments, the first semiconductor layer of the second light emitting element may be provided on an upper surface of the second conductivity type semiconductor layer.

In some embodiments, the first semiconductor layer of the second light emitting element may be doped with impurities of the first conductivity type, and the second semiconductor layer of the second light emitting element may be doped with impurities of the second conductivity type.

In some embodiments, the first light emitting element, the PN junction layer, and the second light emitting element may operate as a first diode, a second diode, and a third diode in an equivalent circuit of the light emitting device. In such embodiments, a cathode of the second diode may be coupled to an anode of the first diode, a cathode of the third diode may be coupled to an anode of the second diode, a common ground may be coupled to a cathode of the first diode, the anode of the second diode, and the cathode of the third diode, and an individual driving voltage line may be coupled to each of the anode of the first diode and the anode of the third diode.

In some embodiments, the active layer of the first light emitting element and the active layer of the second light emitting element may include a nitride semiconductor material containing indium (In), and an indium content in the active layer of the first light emitting element may be less than an indium content in the active layer of the second light emitting element.

In some embodiments, the PN junction layer provided on the first light emitting element may be a first PN junction layer, and the light emitting device may further include a second PN junction layer provided on the second light emitting element, and a third light emitting element provided on the second PN junction layer and configured to emit light of a third wavelength different from the first wavelength and the second wavelength. The second PN junction layer may include a first conductivity type semiconductor layer provided on the second light emitting element and doped with impurities of the first conductivity type, and a second conductivity type semiconductor layer provided on the first conductivity type semiconductor layer of the second PN junction layer and doped with impurities of the second conductivity type.

In some embodiments, each of the first light emitting element, the second light emitting element, and the third light emitting element may include a first semiconductor layer, a second semiconductor layer, and an active layer provided between the first semiconductor layer and the second semiconductor layer.

In some embodiments, the first conductivity type semiconductor layer of the first PN junction layer may be provided on an upper surface of the second semiconductor layer of the first light emitting element. In such embodiments, the first semiconductor layer of the second light emitting element may be provided on an upper surface of the second conductivity type semiconductor layer of the first PN junction layer. In such embodiments, the first conductivity type semiconductor layer of the second PN junction layer may be provided on an upper surface of the second semiconductor layer of the second light emitting element. In such embodiments, the first semiconductor layer of the third light emitting element may be provided on an upper surface of the second conductivity type semiconductor layer of the second PN junction layer.

In some embodiments, the first semiconductor layer of the first light emitting element, the first conductivity type semiconductor layer of the first PN junction layer, the first semiconductor layer of the second light emitting element, the first conductivity type semiconductor layer of the second PN junction layer, and the first semiconductor layer of the third light emitting element may be doped with impurities of the first conductivity type, and the second semiconductor layer of the first light emitting element, the second conductivity type semiconductor layer of the first PN junction layer, the second semiconductor layer of the second light emitting element, the second conductivity type semiconductor layer of the second PN junction layer, and the second semiconductor layer of the third light emitting element may be doped with impurities of the second conductivity type.

In some embodiments, the first light emitting element, the first PN junction layer, the second light emitting element, the second PN junction layer, and the third light emitting element may operate as a first diode, a second diode, a third diode, a fourth diode, and a fifth diode in an equivalent circuit of the light emitting device. In such embodiments, a cathode of the second diode may be coupled to an anode of the first diode, a cathode of the third diode may be coupled to an anode of the second diode, a cathode of the fourth diode may be coupled to an anode of the third diode, a cathode of the fifth diode may be coupled to an anode of the fourth diode, a common ground may be coupled to the cathode of the first diode, the anode of the second diode, the cathode of the third diode, the anode of the fourth diode, and the cathode of the fifth diode, and an individual driving voltage line may be coupled to each of the anode of the first diode, the anode of the third diode, and the anode of the fifth diode.

In some embodiments, the active layer of the first light emitting element, the active layer of the second light emitting element, and the active layer of the third light emitting element may each include a nitride semiconductor material including indium (In). In such embodiments, an indium content in the active layer of the first light emitting element may be less than an indium content in the active layer of the second light emitting element, and an indium content in the active layer of the second light emitting element may be less than an indium content in the active layer of the third light emitting element.

In some embodiments, a first edge region of the upper surface of the first semiconductor layer of the first light emitting element, a first edge region of the upper surface of the first semiconductor layer of the second light emitting element, a first edge region of the upper surface of the first semiconductor layer of the third light emitting element may be exposed. In such embodiments, a second edge region of the upper surface of the second semiconductor layer of the first light emitting element, and a second edge region of the upper surface of the second semiconductor layer of the second light emitting element may be exposed. In such embodiments, the light emitting device may further include a first electrode provided in the second edge region of the upper surface of the second semiconductor layer of the first light emitting element, a second electrode provided in the second edge region of the upper surface of the second semiconductor layer of the second light emitting element, a third electrode provided on the upper surface of the second semiconductor layer of the third light emitting element, and a common electrode integrally provided in the first edge region of the upper surface of the first semiconductor layer of the first light emitting element, the first edge region of the upper surface of the first semiconductor layer of the second light emitting element, and the first edge region of the upper surface of the first semiconductor layer of the third light emitting element.

In some embodiments, a first side surface of the active layer of the first light emitting element, a first side surface of the second semiconductor layer of the first light emitting element, a first side surface of the first conductivity type semiconductor layer of the first PN junction layer, a first side surface of the second conductivity type semiconductor layer of the first PN junction layer, and a first side surface of the first semiconductor layer of the second light emitting element may form a first plane continuously extending in a vertical direction. In such embodiments, a first side surface of the active layer of the second light emitting element, a first side surface of the second semiconductor layer of the second light emitting element, a first side surface of the second conductivity type semiconductor layer of the second PN junction layer, a first side surface of the second conductivity type semiconductor layer of the second PN junction layer, and a first side surface of the first semiconductor layer of the third light emitting element may form a second plane continuously extending in the vertical direction. In such embodiments, the light emitting device may further include an insulating layer extending in the vertical direction along each of the first plane and the second plane.

In some embodiments, the common electrode may integrally extend along the first edge region of the upper surface of the first semiconductor layer of the first light emitting element, the insulating layer on the first plane, the first edge region of the upper surface of the first semiconductor layer of the second light emitting element, the insulating layer on the second plane, and the first edge region of the upper surface of the first semiconductor layer of the third light emitting element.

According to an aspect of the present disclosure, a display apparatus is provided. The display apparatus includes a first light emitting device (LED), a second LED, and a third LED that are stacked in a vertical direction and configured to emit light of different wavelengths. Two opposing edge regions on an upper surface of each of the first LED, the second LED, and the third LED are etched away to be exposed. Each of the first LED, the second LED, and the third LED includes a first nitride semiconductor material and a second nitride semiconductor material with opposite conductivity types, an active layer configured to emit light and provided between the first light emitting element and the second nitride semiconductor material in the vertical direction, a common n-type electrode provided on one of the two opposing edge regions on the upper surface of each of the first LED, the second LED, and the third LED, and a plurality of p-type electrodes provided on another one of the two opposing edge regions on the upper surface of each of the first LED, the second LED, and the third LED.

According to an aspect of the present disclosure, a display apparatus is provided. The display apparatus includes a pixel array including a plurality of pixels provided in a two-dimensional array, a scan driving circuit for providing a scan signal, a data driving circuit for providing a data signal, and a processor configured to control operations of the scan driving circuit and the data driving circuit. Each of the plurality of pixels in the pixel array includes a first light emitting element configured to emit light of a first wavelength, a PN junction layer provided on the first light emitting element, and a second light emitting element provided on the PN junction layer and configured to emit light of a second wavelength different from the first wavelength. The PN junction layer includes a first conductivity type semiconductor layer provided on the first light emitting element and doped with impurities of a first conductivity type, and a second conductivity type semiconductor layer provided on the first conductivity type semiconductor layer and doped with impurities of a second conductivity type electrically opposite to the first conductivity type.

Additional aspects are set forth in part in the description which follows and, in part, may be apparent from the description, and/or may be learned by practice of the presented embodiments of the disclosure.

BRIEF DESCRIPTION OF THE DRAWINGS

The above and other aspects, features, and advantages of certain embodiments of the disclosure may be more apparent from the following description taken in conjunction with the accompanying drawings, in which.

DETAILED DESCRIPTION

Figure 1:
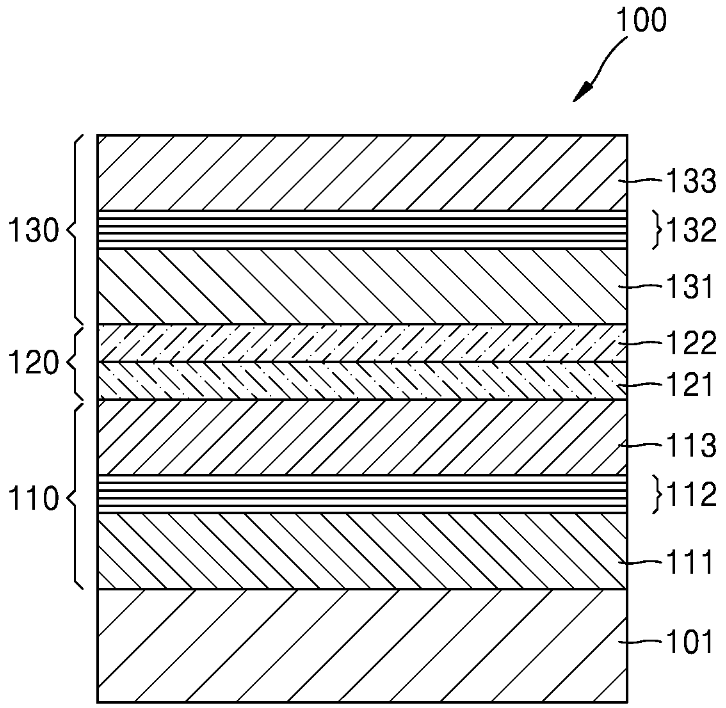
FIG. 1 is a schematic cross-sectional view illustrating a structure of a light emitting device, according to an embodiment.

Reference is now made to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases.

Hereinafter, a light emitting device and a display apparatus including the same is described with reference to the accompanying drawings. In the following drawings, the size of each component in the drawings may be exaggerated for clarity and convenience of description. In addition, the embodiments described below are merely exemplary and various modifications are possible from these embodiments.

Hereinafter, the term "upper portion" or "on" may also include "to be present above on a non-contact basis" as well as "to be on the top portion in directly contact with". The singular expression includes plural expressions unless the context clearly implies otherwise. In addition, when a part "includes" a component, this means that it may further include other components, not excluding other components unless otherwise opposed.

It may be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

The use of the term "the" and similar indicative terms may correspond to both singular and plural. If there is no explicit description or contrary description of the order of the steps or operations constituting the method, these steps or operations may be carried out in an appropriate order and are not necessarily limited to the described order.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

Further, the terms "unit", "module" or the like may refer to a unit that processes at least one function or operation, which may be implemented in hardware or software or implemented in a combination of hardware and software.

The connection or connection members of lines between the components shown in the drawings may exemplarily represent functional connections and/or physical or circuit connections, and/or may be replaceable or represented as various additional functional connections, physical connections, or circuit connections in an actual device.

As used herein, each of the terms "AlGaN", "AlN", "$Al_2O_3$", "GaN", "InAlGaN", "InGaN, "InN", "SiN", "$SiO_2$", and the like may refer to a material made of elements included in each of the terms and is not a chemical formula representing a stoichiometric relationship.

The use of examples or exemplary terms is merely for describing a technical idea in detail and the scope is not limited to the examples or exemplary terms unless limited by the claims.

FIG. 1 is a schematic cross-sectional view illustrating a structure of a light emitting device according to an embodiment. Referring to FIG. 1, a light emitting device 100 may include a first light emitting element 110 configured to emit light of a first wavelength, a PN junction layer 120 provided on the first light emitting element 110, and a second light emitting element 130 that is provided on the PN junction layer 120 and configured to emit light of a second wavelength different from the first wavelength. The first light emitting element 110 and the second light emitting element 130 may be realized as a light emitting diode (LED).

The first light emitting element 110 may have an epitaxial structure grown on the upper surface of the substrate 101. For example, the first light emitting element 110 may include a first semiconductor layer 111 grown on a substrate 101, an active layer 112 grown on the first semiconductor layer 111, and a second semiconductor layer 113 grown on the active layer 112. Accordingly, the first semiconductor layer 111, the active layer 112, and the second semiconductor layer 113 of the first light emitting element 110 may have a vertical stacked structure, and the active layer 112 may be provided between the first semiconductor layer 111 and the second semiconductor layer 113.

Although omitted for simplicity, various layers for improving the performance of the first light emitting element 110 may be further provided in FIG. 1. For example, at least one more buffer layer may be provided between the substrate 101 and the first semiconductor layer 111 to relax stress caused by lattice mismatch. Alternatively or additionally, carrier blocking layers and/or stress relaxation layers may be further provided between the first semiconductor layer 111 and the active layer 112 and between the active layer 112 and the second semiconductor layer 113. Hereinafter, for simplicity of description, only the minimum configurations required for basic operation of the first and second light emitting elements 110 and 130 are described. However, it is to be understood that, in practice, the actual first and second light emitting elements 110 and 130 may further include various additional configurations which may not be described herein.

The first semiconductor layer 111 and the second semiconductor layer 113 may include a group II-VI and/or a group III-V compound semiconductor material, such as, but not limited to, a nitride semiconductor material. For example, the first semiconductor layer 111 and the second semiconductor layer 113 may include at least one nitride semiconductor material such as, but not limited to, InAlGaN, GaN, AlGaN, InGaN, AlN, and InN.

In an embodiment, the first semiconductor layer 111 and the second semiconductor layer 113 may serve to provide electrons and/or holes to the active layer 112. To this end, the first semiconductor layer 111 may be doped with impurities of a first conductivity type, and the second semiconductor layer 113 may be doped with impurities of a second conductivity type that may be electrically opposite to the first conductivity type. For example, the first semiconductor layer 111 may be doped with impurities of an n-type and the second semiconductor layer 113 may be doped with impurities of a p-type. Alternatively or additionally, the first semiconductor layer 111 may be doped with impurities of a p-type and the second semiconductor layer 113 may be doped with impurities of an n-type.

When the first semiconductor layer 111 and/or the second semiconductor layer 113 are doped with impurities of an n-type, for example, dopants such as, but not limited to, silicon (Si), germanium (Ge), tin (Sn), and the like may be used. Alternatively or additionally, when the first semiconductor layer 111 and/or the second semiconductor layer 113 is doped with impurities of a p-type, for example, dopants such as, but not limited to, magnesium (Mg), zinc (Zn), and the like may be used. In an embodiment, the n-type doped first semiconductor layer 111 and/or second semiconductor layer 113 may provide electrons to the active layer 112. In an optional or additional embodiment, the p-type doped second semiconductor layer 113 and/or first semiconductor layer 111 may provide holes to the active layer 112.

In an embodiment, the active layer 112 may be located in the middle of the first light emitting element 110, for example, sandwiched between two layers of a different semiconductor material having different electrical properties, such as n-type and p-type layers. That is, the active layer 112 may be provided between the first semiconductor layer 111 and the second semiconductor layer 113. Alternatively or additionally, the active layer 112 may be configured to emit light when an electric current is passed through the active layer 112. For example, the n-type layer may have an excess of electrons, while the p-type layer may have a deficiency of electrons and consequently may create holes that may accept electrons. Therefore, when a voltage is applied to the first light emitting element 110, electrons may flow from the n-type layer to the p-type layer, and may be combined with the holes in the p-type layer.

The active layer 112 may have a quantum well structure in which quantum wells may be provided between barriers. The quantum wells may refer to thin layers of semiconductor material with a thickness on the order of a few nanometers. As electrons and holes provided from the first semiconductor layer 111 and the second semiconductor layer 113 are recombined within the quantum wells in the active layer 112, light may be generated and emitted from the active layer 112. In an embodiment, the quantum wells may confine the electrons and holes to a small region, thus increasing the probability that the electrons and holes may recombine and emit light.

The wavelength of light generated in the active layer 112 may be determined according to the energy band gap of the material forming the quantum wells in the active layer 112. In an embodiment, the active layer 112 may have only one quantum well, but may have a multi-quantum well (MQW) structure in which a plurality of quantum wells and a plurality of barriers may be alternately arranged. The thickness of the active layer 112 and/or the number of quantum wells in the active layer 112 may be appropriately selected in consideration of the driving voltage and the light emitting efficiency of the first light emitting element 110.

In an embodiment, the active layer 112 may include a group II-VI and/or a group III-V compound semiconductor material, such as, but not limited to, a nitride semiconductor material. For example, the active layer 112 may include at least one nitride semiconductor material from among InGaN, GaN, AlGaN, and AlInGaN. However, the present disclosure is not limited in this regard, and the active layer 112 may include other types of compound semiconductor materials.

Continuing to refer to FIG. 1, the PN junction layer 120 may include a first conductivity type semiconductor layer 121 provided on the first light emitting element 110 and doped in a first conductivity type (e.g., a p-type semiconductor), and a second conductivity type semiconductor layer 122 provided on the first conductivity type semiconductor layer 121 and doped in a second conductivity type (e.g., an n-type semiconductor). The first conductivity type semiconductor layer 121 and the second conductivity type semiconductor layer 122 may be and/or may include p-type and n-type regions that may act as a barrier to the flow of current when the first light emitting element 110 is turned off. In an operating mode, a voltage may be applied to the first light emitting element 110 in a forward direction so that an electric field at the PN junction layer 120 is reduced to allow current to flow. In a non-operating mode, a voltage may be applied to the first light emitting element 110 in a reverse direction so that the electric field at the PN junction layer 120 is increased to prevent current from flowing.

The first conductivity type semiconductor layer 121 may grow directly on the upper surface of the second semiconductor layer 113 of the first light emitting element 110, and the second conductivity type semiconductor layer 122 may grow directly on the upper surface of the first conductivity type semiconductor layer 121. The first conductivity type semiconductor layer 121 and the second conductivity type semiconductor layer 122 may include a group II-VI and/or a group III-V compound semiconductor material, such as, but not limited to, a nitride semiconductor material. For example, the first conductivity type semiconductor layer 121 and the second conductivity type semiconductor layer 122 may include, but not be limited to, InAlGaN or GaN.

In an embodiment, the thicknesses of the first conductivity type semiconductor layer 121 and the second conductivity type semiconductor layer 122 may be, for example, about 1 nanometer (nm) or more to about 1 micrometer (μm) or less. For another example, a first thickness of the first conductivity type semiconductor layer 121 and a second thickness of the second conductivity type semiconductor layer 122 may each be about 50 nm or more and about 200 nm or less.

The first conductivity type semiconductor layer 121 may be doped in a conductivity type that may be electrically opposite to the second semiconductor layer 113 of the first light emitting element 110, and the second conductivity type semiconductor layer 122 may be doped in the same conductivity type as the second semiconductor layer 113 of the first light emitting element 110. For example, when the second semiconductor layer 113 of the first light emitting element 110 is doped in a p-type, the first conductivity type semiconductor layer 121 may be doped win an n-type and the second conductivity type semiconductor layer 122 may be doped in a p-type. Alternatively or additionally, the first conductivity type semiconductor layer 121 may be doped with a material such as, but not limited to, silicon (Si), germanium (Ge), tin (Sn), and the like, and the second conductivity type semiconductor layer 122 may be doped with a material such as, but not limited to, magnesium (Mg), zinc (Zn), and the like.

In an embodiment, the doping concentrations of the first conductivity type semiconductor layer 121 (e.g., an n-type semiconductor) and the second conductivity type semiconductor layer 122 (e.g., a p-type semiconductor) maybe, for example, about $10^{16}/cm^3$ or more to about $10^{20}/cm^3$ or less. For another example, the doping concentrations may range from about $10^{17}/cm^3$ to about $10^{19}/cm^3$.

Continuing to refer to FIG. 1, the second light emitting element 130 may have an epitaxial structure grown on the upper surface of the PN junction layer 120. For example, the second light emitting element 130 may include a first semiconductor layer 131 grown on the upper surface of the second conductivity type semiconductor layer 122, an active layer 132 grown on the upper surface of the first semiconductor layer 131, and a second semiconductor layer 133 grown on the upper surface of the active layer 132. Accordingly, the first semiconductor layer 131, the active layer 132, and the second semiconductor layer 133 of the second light emitting element 130 may have a vertical stacked structure, and the active layer 132 may be provided between the first semiconductor layer 131 and the second semiconductor layer 133.

The description of the first semiconductor layer 111 and the second semiconductor layer 113 of the first light emitting element 110 may also be applied to the first semiconductor layer 131 and the second semiconductor layer 133 of the second light emitting element 130. For example, the first semiconductor layer 131 and the second semiconductor layer 133 of the second light emitting element 130 may include at least one nitride semiconductor material such as, but not limited to, InAlGaN, GaN, AlGaN, InGaN, AlN, and InN.

Alternatively or additionally, the first semiconductor layer 131 and the second semiconductor layer 133 may be doped in conductivity types that may be electrically opposite to each other. For example, the first semiconductor layer 131 may be doped in a first conductivity type that may be electrically opposite to the second conductivity type semiconductor layer 122 provided therebelow. For another example, the second semiconductor layer 133 may be doped in the same second conductivity type as the second conductivity type semiconductor layer 122.

In an embodiment, the active layer 112 of the first light emitting element 110 may be configured to emit light of a first wavelength. In an optional or additional embodiment, the active layer 132 of the second light emitting element 130 may be configured to emit light of a second wavelength different from the first wavelength. To this end, the compositions of the nitride semiconductor material may be different from each other in the active layer 112 of the first light emitting element 110 and the active layer 132 of the second light emitting element 130. In general, as the content of indium (In) in the nitride semiconductor material including indium (In) increases, the wavelength of the resulting emitted light may increase. For example, in an active layer containing InGaN and/or AlInGaN, when the indium content in the nitride semiconductor material is about 15%, the active layer may emit blue light having a wavelength of about 450 nm. For another example, when the indium content is increased to about 25%, the active layer may emit a green light having a wavelength of about 520 nm of green light. For yet another example, when the indium content is further increased to about 30%, the active layer may emit yellow light having a wavelength of about 560 nm. For yet another example, when the indium content is further increased to about 35%, the active layer may emit a red light having a wavelength of about 630 nm.

In one embodiment, the active layer 112 of the first light emitting element 110 provided at the bottom may be configured to emit light of a relatively short wavelength, and the active layer 132 of the second light emitting element 130 provided at the top may be configured to emit light of a relatively long wavelength. For example, the active layer 112 may be configured to emit blue light and the active layer 132 may be configured to emit green light or red light. Alternatively or additionally, the active layer 112 may be configured to emit green light and the active layer 132 may be configured to emit red light. Accordingly, the indium content in the active layer 112 of the first light emitting element 110 provided at the bottom may be less than the indium content in the active layer 132 of the second light emitting element 130 provided at the top. Typically, as the indium content of the nitride semiconductor is decreased (e.g., is lower), the growth temperature of the nitride semiconductor may increase (e.g., is higher). Therefore, it may be advantageous to grow a nitride semiconductor with a relatively high growth temperature first and then grow a nitride semiconductor with a relatively low growth temperature later. That is, when the active layer 112 containing a nitride semiconductor with a relatively low indium content is grown first (e.g., relatively high growth temperature), the active layer 112 below the active layer 132 may not deteriorate in the process of growing the active layer 132 containing a nitride semiconductor with a relatively high indium content (e.g., relatively low growth temperature).

As described above, the PN junction layer 120, including the first conductivity type semiconductor layer 121 and the second conductivity type semiconductor layer 122, may be provided between the first light emitting element 110 and the second light emitting element 130. In an embodiment, the first semiconductor layer 111 of the first light emitting element 110, the first conductivity type semiconductor layer 121 of the PN junction layer 120, and the first semiconductor layer 131 of the second light emitting element 130 may be doped in the same first conductivity type. In an optional or additional embodiment, the second semiconductor layer 113 of the first light emitting element 110, the second conductivity type semiconductor layer 122 of the PN junction layer 120, and the second semiconductor layer 133 of the second light emitting element 130 may be doped in the same second conductivity type. For example, when the first conductivity type is an n-type and the second conductivity type is a p-type, the light emitting device 100 may have an n-i-p-n-p-n-i-p structure. Accordingly, current leakage may be prevented from occurring between the first light emitting element 110 and the second light emitting element 130.

Figure 2:
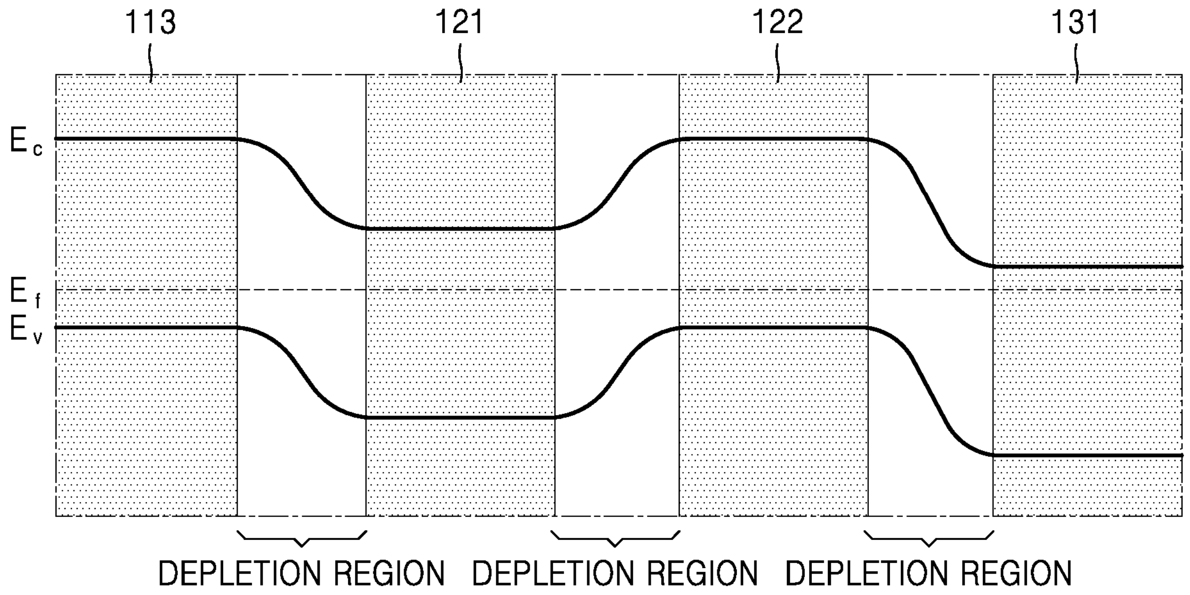
FIG. 2 shows an energy band diagram near a PN junction layer shown in FIG. 1, according to an embodiment.

FIG. 2 shows an energy band diagram near the PN junction layer 120 shown in FIG. 1, where Ev, Ec, and Et represent a valence band (e.g., the highest filled band), a conduction band (e.g., the lowest empty band), and a Fermi level, respectively. Referring to FIG. 2, the second semiconductor layer 113 of the first light emitting element 110, the first conductivity type semiconductor layer 121 of the PN junction layer 120, the second conductivity type semiconductor layer 122 of the PN junction layer 120, and the first semiconductor layer 131 of the second light emitting element 130 may be and/or include semiconductors of a p-type, n-type, p-type, and n-type, for example, respectively. In such an example, a depletion region may be formed at an interface between two adjacent layers. Alternatively or additionally, a current may flow from the second semiconductor layer 113 of the first light emitting element 110 to the first conductivity type semiconductor layer 121. However, since the second conductivity type semiconductor layer 122 having relatively high energy is located between the first conductivity type semiconductor layer 121 and the first semiconductor layer 131 of the second light emitting element 130, current may not flow from the first conductivity type semiconductor layer 121 to the first semiconductor layer 131 of the second light emitting element 130.

Figure 3A:
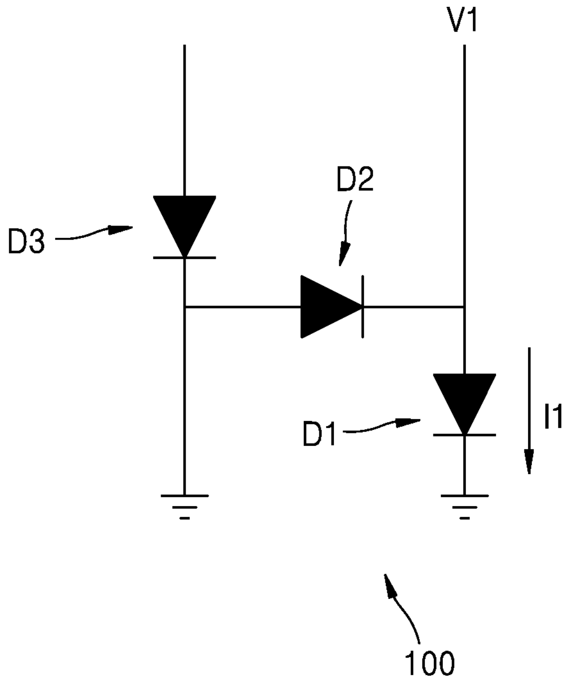
FIGS. 3A and 3B are equivalent circuit diagrams illustrating an operation of a light emitting device, according to an embodiment.
Figure 3B:
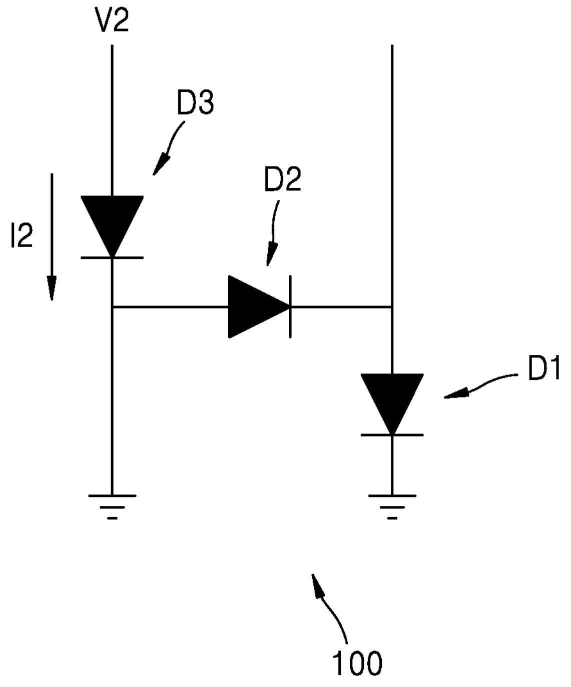

FIGS. 3A and 3B are equivalent circuit diagrams illustrating an operation of a light emitting device 100, according to an embodiment. Referring to FIGS. 3A and 3B, the first light emitting element 110, the PN junction layer 120, and the second light emitting element 130 may be respectively indicated by diodes. As shown in FIGS. 3A and 3B, the first diode D1 may represent the first light emitting element 110, the second diode D2 may represent the PN junction layer 120, and the third diode D3 may represent the second light emitting element 130.

For example, the cathode of the first diode D1 may correspond to the first semiconductor layer 111 of the first light emitting element 110, the anode of the first diode D1 may correspond to the second semiconductor layer 113 of the first light emitting element 110. Alternatively or additionally, the cathode of the second diode D2 may correspond to the first conductivity type semiconductor layer 121 of the PN junction layer 120, and the anode of the second diode D2 may correspond to the second conductivity type semiconductor layer 122 of the PN junction layer 120. For another example, the cathode of the third diode D3 may correspond to the first semiconductor layer 131 of the second light emitting element 130, and the anode of the third diode D3 may correspond to the second semiconductor layer 133 of the second light emitting element 130.

In an embodiment, the light emitting device 100 may include a third diode D3, a second diode D2, and a first diode D1, which may be sequentially connected in the forward direction. In other words, the cathode of the second diode D2 may be connected to the anode of the first diode D1, and the cathode of the third diode D3 may be connected to the anode of the second diode D2. Alternatively or additionally, a common ground may be connected to the cathode of the first diode D1, the anode of the second diode D2, and the cathode of the third diode D3. In an optional or additional embodiment, driving voltage lines may be individually connected to the anode of the third diode D3 and the anode of the first diode D1, respectively.

Referring to FIG. 3A, when a driving voltage V1 is applied to the anode of the first diode D1, a current 11 may be in the reverse direction with respect to the second diode D2, and thus may not pass through the second diode D2, and may only flow to the first diode D1. Alternatively or additionally, referring to FIG. 3B, when a driving voltage V2 is applied to the anode of the third diode D3, a current 12 may only flow to the third diode D3 because a potential across both ends of the second diode D2 may be the same as a potential across both ends of the first diode D1. The driving voltage V1 and the current 11 may be the same as the driving voltage V2 and the current 12, respectively, and/or may be different from the driving voltage V2 and the current 12.

As described above, the PN junction layer 120, which is provided between the first light emitting element 110 and the second light emitting element 130, may potentially prevent and/or reduce current leakage between the first light emitting element 110 and the second light emitting element 130, when the first light emitting element 110 and the second light emitting element 130 are emitting light of different wavelengths in the same electrical direction. Therefore, when the first light emitting element 110 and/or the second light emitting element 130 is turned on and/or turned off, each light emitting element (e.g., first light emitting element 110, second light emitting element 130) may have little effect and/or no effect on other adjacent light emitting elements (e.g., first light emitting element 110, second light emitting element 130). Accordingly, the first light emitting element 110 and the second light emitting element 130 may be driven independently of each other.

Alternatively or additionally, since the PN junction layer 120 may include substantially similar and/or the same semiconductor materials to those of the first light emitting element 110 and the second light emitting element 130, the first light emitting element 110, the PN junction layer 120, and the second light emitting element 130 may be monolithically grown. Therefore, a monolithic light emitting device 100 with an epitaxial structure in which the first light emitting element 110 having a wavelength, the second light emitting element 130 having a different wavelength, and the PN junction layer 120 are vertically grown and stacked on a single growth substrate may be manufactured.

Although the description of the light emitting device 100 focused on a device including two light emitting elements, the concepts described herein may be applicable to provide a light emitting device including three or more light emitting elements using similar principles.

Figure 4:
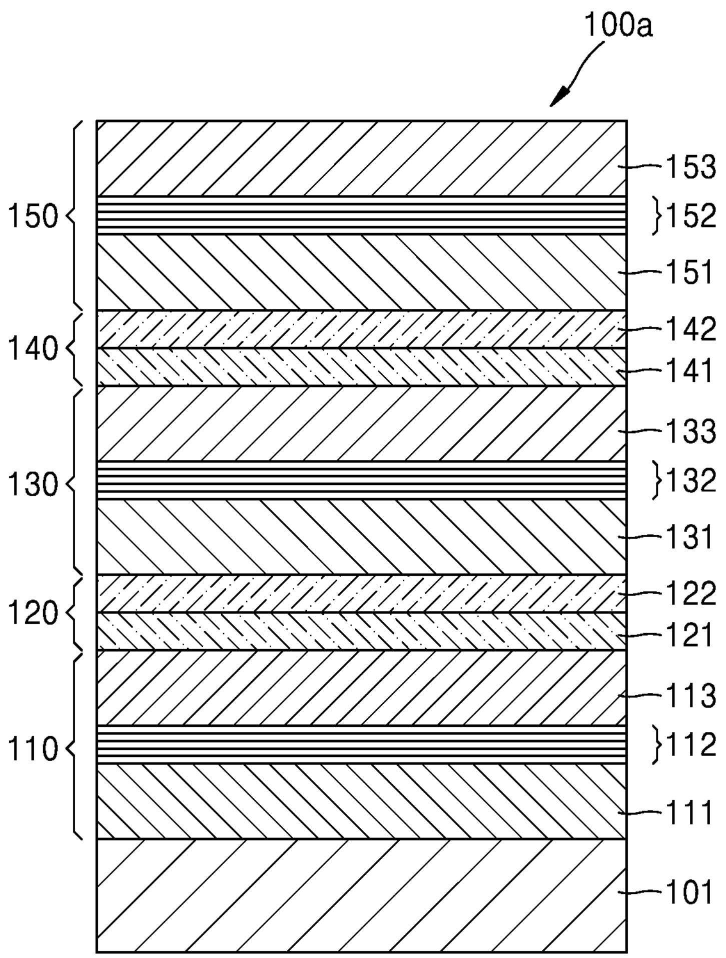
FIG. 4 is a schematic cross-sectional view illustrating a structure of a light emitting device, according to another embodiment.

FIG. 4 is a schematic cross-sectional view illustrating a structure of a light emitting device, according to an embodiment. Referring to FIG. 4, a light emitting device 100*a* may include a first light emitting element 110, a PN junction layer 120, a second light emitting element 130, a PN junction layer 140, and a third light emitting element 150 that are monolithically grown sequentially on a substrate 101.

Hereinafter, the PN junction layer 120 between the first light emitting element 110 and the second light emitting element 130 may be referred to as a first PN junction layer 120, and the PN junction layer 140 between the second light emitting element 130 and the third light emitting element 150 may be referred to as a second PN junction layer 140.

The first light emitting element 110, the first PN junction layer 120, and the second light emitting element 130 of FIG. 4 may include and/or may be similar in many respects to the first light emitting element 110, the PN junction layer 120, and the second light emitting element 130 described above with reference to FIGS. 1, 2, 3A, and 3B, and may include additional features not mentioned above. Repeated descriptions of the first light emitting element 110, the PN junction layer 120, and the second light emitting element 130 may be omitted for the sake of brevity.

The second PN junction layer 140 may have a substantially similar and/or the same structure as the first PN junction layer 120. For example. the second PN junction layer 140 may include a first conductivity type semiconductor layer 141 provided on the second light emitting element 130 and doped in a first conductivity type, and a second conductivity type semiconductor layer 142 provided on the first conductivity type semiconductor layer 141 and doped in a second conductivity type.

The first conductivity type semiconductor layer 141 may be grown on the second semiconductor layer 133 of the second light emitting element 130, and/or the second conductivity type semiconductor layer 142 may be grown on the first conductivity type semiconductor layer 141.

The first conductivity type semiconductor layer 141 and the second conductivity type semiconductor layer 142 may include a group II-VI and/or a group III-V compound semiconductor material, such as, but not limited to, a nitride semiconductor material. For example, the first conductivity type semiconductor layer 141 and the second conductivity type semiconductor layer 142 may include at least one nitride semiconductor material such as, but not limited to, InAlGaN and GaN.

The thicknesses of the first conductivity type semiconductor layer 141 and the second conductivity type semiconductor layer 142 may be, for example, about 1 nm or more to about 1 μm or less. For another example, a first thickness of the first conductivity type semiconductor layer 141 and a second thickness of the second conductivity type semiconductor layer 142 may each be about 50 nm or more and about 200 nm or less. Furthermore, the doping concentrations of the first conductivity type semiconductor layer 141 and the second conductivity type semiconductor layer 142 may be, for example, about $10^{16}/cm^3$ or more to about $10^{20}/cm^3$ or less. For another example, the doping concentrations may range from about $10^{17}/cm^3$ to about $10^{19}/cm^3$.

Continuing to refer to FIG. 4, the third light emitting element 150 may have an epitaxial structure grown on the upper surface of the second PN junction layer 140. For example, the third light emitting element 150 may include a first semiconductor layer 151 grown on the second conductivity type semiconductor layer 142, an active layer 152 grown on the first semiconductor layer 151, and a second semiconductor layer 153 grown on the active layer 152.

Descriptions of the first semiconductor layers 111 and 131 and of the second semiconductor layers 113 and 133 of the first and second light emitting elements 110 and 130 may also be applied to the first semiconductor layer 151 and the second semiconductor layer 153 of the third light emitting element 150, respectively. For example, the first semiconductor layer 151 and the second semiconductor layer 153 of the third light emitting element 150 may include at least one nitride semiconductor material such as, but not limited to, InAlGaN, GaN, AlGaN, InGaN, AlN, and InN.

Alternatively or additionally, the first semiconductor layer 151 and the second semiconductor layer 153 may be doped in conductivity types that may be electrically opposite to each other. For example, the first semiconductor layer 151 may be doped in a first conductivity type electrically opposite to the second conductivity type semiconductor layer 142 provided therebelow. For another example, the second semiconductor layer 153 may be doped in the same second conductivity type as the second conductivity type semiconductor layer 142. Therefore, the first semiconductor layer 111 of the first light emitting element 110, the first conductive semiconductor layer 121 of the first PN junction layer 120, the first semiconductor layer 131 of the second light emitting element 130, the first conductivity type semiconductor layer 141 of the second PN junction layer 140, and the first semiconductor layer 151 of the third light emitting element 150 may be doped in the same first conductivity type, and the second semiconductor layer 113 of the first light emitting element 110, the second conductivity type semiconductor layer 122 of the first PN junction layer 120, the second semiconductor layer 133 of the second light emitting element 130, the second conductivity type semiconductor layer 142 of the second PN junction layer 140, and the second semiconductor layer 153 of the third light emitting element 150 may be doped in the same second conductivity type. For example, when the first conductivity type is an n-type and the second conductivity type is a p-type, the light emitting device 100*a* may have an n-i-p-n-p-n-i-p-n-p-n-i-p structure.

In an embodiment, the active layer 152 of the third light emitting element 150 may be configured to emit light having a third wavelength different from the first wavelength and the second wavelength. For example, the active layer 112 of the first light emitting element 110 may be configured to emit blue light, the active layer 132 of the second light emitting element 130 may be configured to emit green light, and the active layer 152 of the third light emitting element 150 may be configured to emit red light.

For example, the indium content in the active layer 112 of the first light emitting element 110 provided at the bottom may be less than the indium content in the active layer 132 of the second light emitting element 130 provided thereon. Alternatively or additionally, the indium content in the active layer 132 of the second light emitting element 130 may be less than the indium content in the active layer 152 of the third light emitting element 150 provided thereabove. For another example, the indium content in the active layer 112 of the first light emitting element 110 may be about 15%, the indium content in the active layer 132 of the second light emitting element 130 may be about 25%, and the indium content in the active layer 152 of the third light emitting element 150 may be about 35%.

A display device including three LEDs (e.g., a red LED, a green LED, and a blue LED) may be implemented using the structure as shown in FIG. 4. For example, a red LED may include an active layer (e.g., the active layer 152) which may be configured to emit red light, and may be sandwiched between two nitride semiconductor materials (e.g., the first and second semiconductor layers 151 and 153) having opposite conductivity types (e.g., pGaN and nGaN). For another example, a green LED may include an active layer (e.g., the active layer 132) which may be configured to green light, and may be sandwiched between two nitride semiconductor materials (e.g., the first and second semiconductor layers 131 and 133) having opposite conductivity types (e.g., pGaN and nGaN). For yet another example, a blue LED may include an active layer (e.g., the active layer 112) which may be configured to emit blue light, and may be sandwiched between two nitride semiconductor materials (e.g., the first and second semiconductor layers 111 and 113) having opposite conductivity types (e.g., pGaN and nGaN). An resistive layer, such as the PN junction layers 120 and 140, may be positioned between two adjacent LEDs (e.g., between the red LED and the green LED, and/or between the green LED and the blue LED) as an electrical barrier between two adjacent LEDs. Alternatively or additionally, instead of the PN junction layers 120 and 140, a u-GaN layer that may have a thickness less than 10 nm, and/or a graphene layer may be used to provide electrical resistance between two adjacent LEDs.

Figure 5:
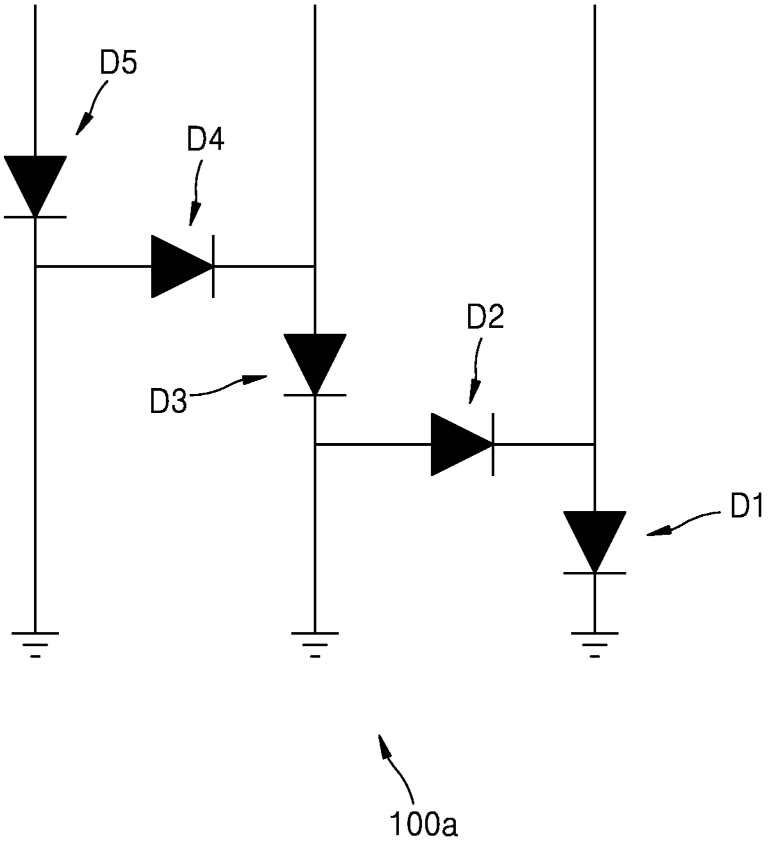
FIG. 5 is an equivalent circuit diagram of the light emitting device illustrated in FIG. 4, according to an embodiment.

FIG. 5 is an equivalent circuit diagram of the light emitting device 100*a* illustrated in FIG. 4. Referring to FIG. 5, a first light emitting element 110, a first PN junction layer 120, a second light emitting element 130, a second PN junction layer 140, and a third light emitting element 150 of the light emitting element 100*a* may be indicated by a first diode D1, a second diode D2, a third diode D3, a fourth diode D4, and a fifth diode D5, respectively.

For example, the cathode and the anode of the first diode D1 may correspond to the first semiconductor layer 111 and the second semiconductor layer 113 of the first light emitting element 110, respectively. For another example, the cathode and the anode of the second diode D2 may correspond to the first conductivity type semiconductor layer 121 and the second conductivity type semiconductor layer 122 of the first PN junction layer 120, respectively. For yet another example, the cathode and anode of the third diode D3 may correspond to the first conductive semiconductor layer 131 and the second conductive semiconductor layer 133 of the second light emitting element 130, respectively. For another example, the cathode and the anode of the fourth diode D4 may correspond to the first conductivity type semiconductor layer 141 and the second conductivity type semiconductor layer 142 of the second PN junction layer 140, respectively. For yet another example, the cathode and the anode of the fifth diode D5 may correspond to the first semiconductor layer 151 and second semiconductor layer 153 of the third light emitting element 150, respectively.

In an embodiment, the fifth diode D5, the fourth diode D4, the third diode D3, the second diode D2, and the first diode D1 may be sequentially connected in the forward direction. In other words, the cathode of the second diode D2 may be connected to the anode of the first diode D1, the cathode of the third diode D3 may be connected to the anode of the second diode D2, the cathode of the fourth diode D4 may be connected to the anode of the third diode D3, and the cathode of the fifth diode D5 may be connected to the anode of the fourth diode D4. Alternatively or additionally, a common ground may be connected to the cathode of the fifth diode D5, the anode of the fourth diode D4, the cathode of the third diode D3, the anode of the second diode D2, and the cathode of the first diode D1. In an optional or additional embodiment, driving voltage lines may be individually connected to the anode of the fifth diode D5, the anode of the third diode D3, and the anode of the first diode D1, respectively.

In the structure described above, when a driving voltage is applied to the anode of the first diode D1, a current may only flow to the first diode D1, for example. Alternatively or additionally, when the driving voltage is applied to the anode of the third diode D3, a current may only flow to the third diode D3. For another example, when the driving voltage is applied to the anode of the fifth diode D5, a current may only flow to the fifth diode D5. Accordingly, the first diode D1, the third diode D3, and the fifth diode D5 may be controlled and/or driven independently of each other.

As a result, the monolithic stacking arrangement of the first light emitting element 110, the third light emitting element 130, and the fifth light emitting element 150 may provide minimal interference between the elements 110, 130, and 150.

Figure 6:
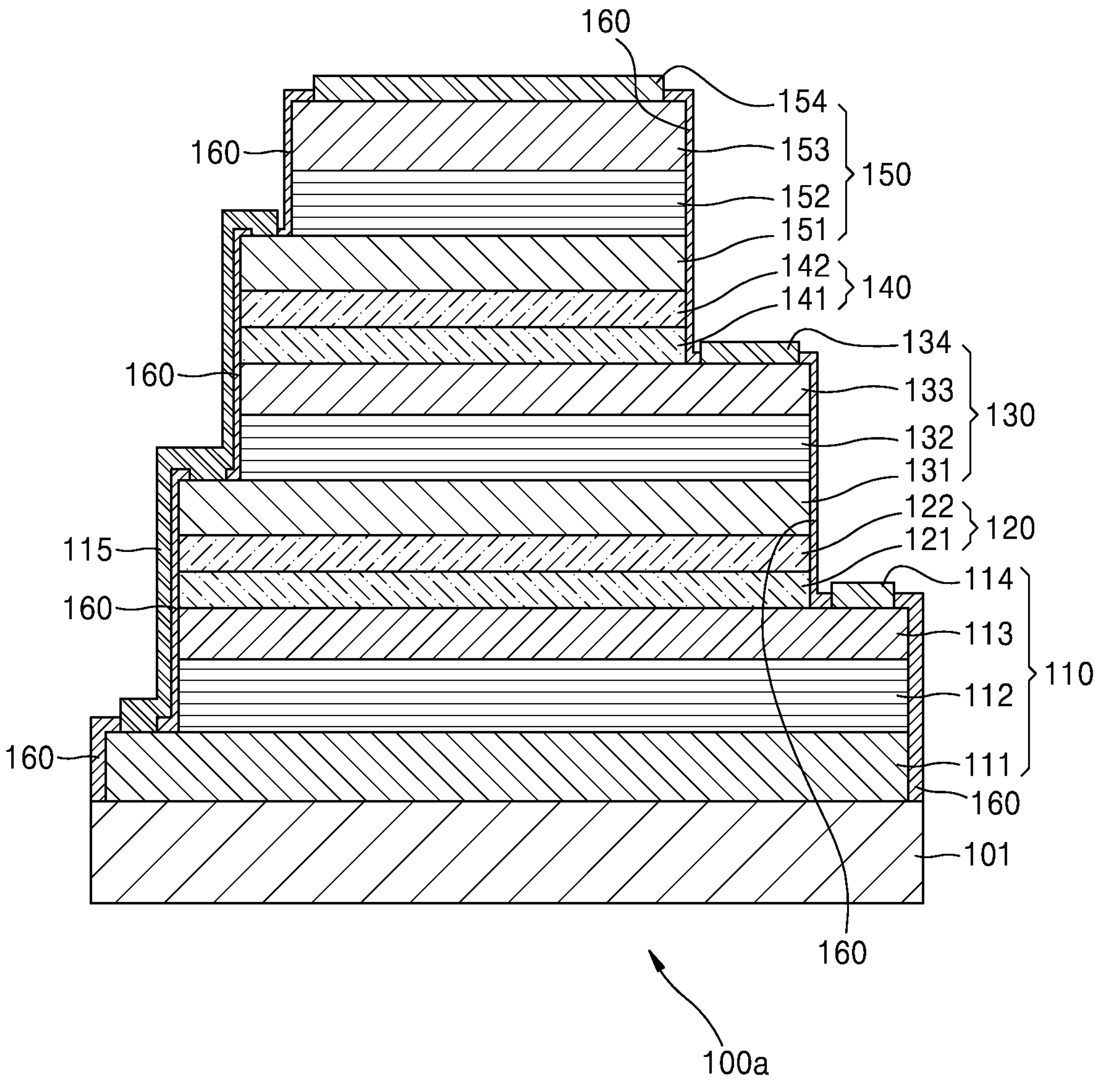
FIG. 6 is a schematic cross-sectional view illustrating an electrode connection structure of the light emitting device illustrated in FIG. 4, according to an embodiment.

FIG. 6 is a schematic cross-sectional view illustrating an electrode connection structure of the light emitting device 100*a* illustrated in FIG. 4. In order to connect the electrodes, specific regions on upper surfaces of the first semiconductor layer 111, 131, and 151 and the second semiconductor layer 113, 133, and 153 of each light-emitting element 110, 130, and 150 may be exposed.

Referring to FIG. 6, for electrode connection, partial regions on upper surfaces of the first semiconductor layer 111 and the second semiconductor layer 113 of the first light emitting element 110, partial regions on the upper surfaces of the first semiconductor layer 131 and the second semiconductor layer 133 of the second light emitting element 130, and/or partial regions on the upper surfaces of the first semiconductor layer 151 and the second semiconductor layer 153 of the third light emitting element 150 may be exposed. To this end, a plurality of layers above the first semiconductor layer 111 of the first light emitting element 110 may be etched. Therefore, the width of the active layer 112 of the first light emitting element 110 may be greater than the width of the active layer 132 of the second light emitting element 130, and/or the width of the active layer 132 of the second light emitting element 130 may be greater than the width of the active layer 152 of the third light emitting element 150.

For example, a first edge region of the upper surface of the first semiconductor layer 111 of the first light emitting element 110, a first edge region of the upper surface of the first semiconductor layer 131 of the second light emitting element 130, and a first edge region of the upper surface of the first semiconductor layer 151 of the third light emitting element 150 may be exposed. Alternatively or additionally, a second edge region of the upper surface of the second semiconductor layer 113 of the first light emitting element 110 and/or a second edge region of the upper surface of the second semiconductor layer 133 of the second light emitting element 130 may be exposed. The first edge region and the second edge region may be opposite regions facing each other on the respective upper surfaces. In an embodiment, the entire area of the upper surface of the second semiconductor layer 153 of the third light emitting element 150 may be exposed.

In an embodiment, a first side surface of the active layer 112 of the first light emitting element 110, a first side surface of the second semiconductor layer 113 of the first light emitting element 110, a first side surface of the first conductivity type semiconductor layer 121 of the first PN junction layer 120, a first side surface of the second conductivity type semiconductor layer 122 of the first PN junction layer 120, and a first side surface of the first semiconductor layer 131 of the second light emitting element 130 may form a first plane continuously extending in the vertical direction. In an optional or additional embodiment, a first side surface of the active layer 132 of the second light emitting element 130, a first side surface of the second semiconductor layer 133 of the second light emitting element 130, a first side surface of the first conductivity type semiconductor layer 141 of the second PN junction layer 140, a first side surface of the second conductivity type semiconductor layer 142 of the second PN junction layer 140, and a first side surface of the first semiconductor layer 151 of the third light emitting element 150 may form a second plane continuously extending in the vertical direction. Alternatively or additionally, a first side surface of the active layer 152 of the third light emitting element 150 and a first side surface of the second semiconductor layer 153 of the third light emitting element 150 may form a third plane continuously extending in the vertical direction.

In an embodiment, a second side surface of the first semiconductor layer 111 of the first light emitting element 110, a second side surface of the active layer 112 of the first light emitting element 110, and a second side surface of the second semiconductor layer 113 of the first light emitting element 110 may form a fourth plane continuously extending in the vertical direction. In an optional or additional embodiment, a second side surface of the first conductivity type semiconductor layer 121 of the first PN junction layer 120, a second side surface of the second conductivity type semiconductor layer 122 of the first PN junction layer 120, a second side surface of the first semiconductor layer 131 of the second light emitting element 130, a second side surface of the active layer 132 of the second light emitting element 130, and a second side surface of the second semiconductor layer 133 of the second light emitting element 130 may form a fifth plane continuously extending in the vertical direction. Alternatively or additionally, a second side surface of the first conductivity type semiconductor layer 141 of the second PN junction layer 140, a second side surface of the second conductivity type semiconductor layer 142 of the second PN junction layer 140, a second side surface of the first semiconductor layer 151 of the third light emitting element 150, a second side surface of the active layer 152 of the third light emitting element 150, and a second side surface of the second semiconductor layer 153 of the third light emitting element 150 may form a sixth plane continuously extending in the vertical direction. The first and second side surfaces may be opposite side surfaces facing each other.

In an embodiment, the first light emitting element 110 may further include a first electrode 114 provided in the second edge region of the upper surface of the second semiconductor layer 113. In an optional or additional embodiment, the second light emitting element 130 may further include a second electrode 134 provided in the second edge region of the upper surface of the second semiconductor layer 133. Alternatively or additionally, the third light emitting element 150 may further include a third electrode 154 provided on the upper surface of the second semiconductor layer 153. In an optional or additional embodiment, a driving voltage may be independently applied to each of the first light emitting element 110, the second light emitting element 130, and the third light emitting element 150 through the first electrode 114, the second electrode 134, and the third electrode 154.

The light emitting device **110*a* may further include an insulating layer 160 extending in the vertical direction along each of the first plane and the second plane. Alternatively or additionally, the light emitting device 110*a* may further include a common electrode 115 provided in the first edge region of the upper surface of the first semiconductor layer 111 of the first light emitting element 110, the first edge region of the upper surface of the first semiconductor layer 131 of the second light emitting element 130, and the first edge region of the upper surface of the first semiconductor layer 151 of the third light emitting element 150**.

In an embodiment, the common electrode 115 may integrally extend along the first edge region of the upper surface of the first semiconductor layer 111 of the first light emitting element 110, the insulating layer 160 on the first plane, the first edge region of the upper surface of the first semiconductor layer 131 of the second light emitting element 130, the insulating layer 160 on the second plane, and the first edge region of the upper surface of the first semiconductor layer 151 of the third light emitting element 150. For example, the common electrode 115 may be a ground electrode.

In an embodiment, the light emitting device 110*a* may further include an insulating layer 160 extending in the vertical direction along each of the third plane, the fourth plane, the fifth plane, and the sixth plane. However, the insulating layer 160 on the third plane, the fourth plane, the fifth plane, and the sixth plane may be omitted and/or replaced by the first insulating layer 202 of FIG. 7.

The light emitting device 100*a*, according to an embodiment, may emit light having a plurality of different wavelengths. For example, one light emitting device 100*a* may individually emit blue light, green light, and/or red light, and/or may independently adjust the intensity of the blue light, green light, and red light, which are being emitted. Therefore, when the light emitting device 100*a* is used, an LED display apparatus may be manufactured without high-level transfer technology.

A display device including three LEDs (e.g., a red LED, a green LED, and a blue LED) may be implemented using the structure as shown in FIG. 6. For example, a red LED may include an active layer (e.g., the active layer 152) which may be configured to emit red light, and may be sandwiched between two nitride semiconductor materials (e.g., the first and second semiconductor layers 151 and 153) having opposite conductivity types (e.g., pGaN and nGaN). For example, a green LED may include an active layer (e.g., the active layer 132) which may be configured to emit green light, and may be sandwiched between two nitride semiconductor materials (e.g., the first and second semiconductor layers 131 and 133) having opposite conductivity types (e.g., pGaN and nGaN). For yet another example, a blue LED may include an active layer (e.g., the active layer 112) which may be configured to emit blue light, and may be sandwiched between two nitride semiconductor materials (e.g., the first and second semiconductor layers 111 and 113) having opposite conductivity types (e.g., pGaN and nGaN). Alternatively or additionally, a resistive layer, such as the PN junction layers 120 and 140, may be positioned between two adjacent LEDs (e.g., between the red LED and the green LED, and between the green LED and the blue LED) as an electrical barrier between two adjacent LEDs. Alternatively or additionally, instead of the PN junction layers 120 and 140, a u-GaN layer that may have a thickness of less than 10 nm, and/or a graphene layer may be used to provide electrical resistance between two adjacent LEDs.

Figure 7:
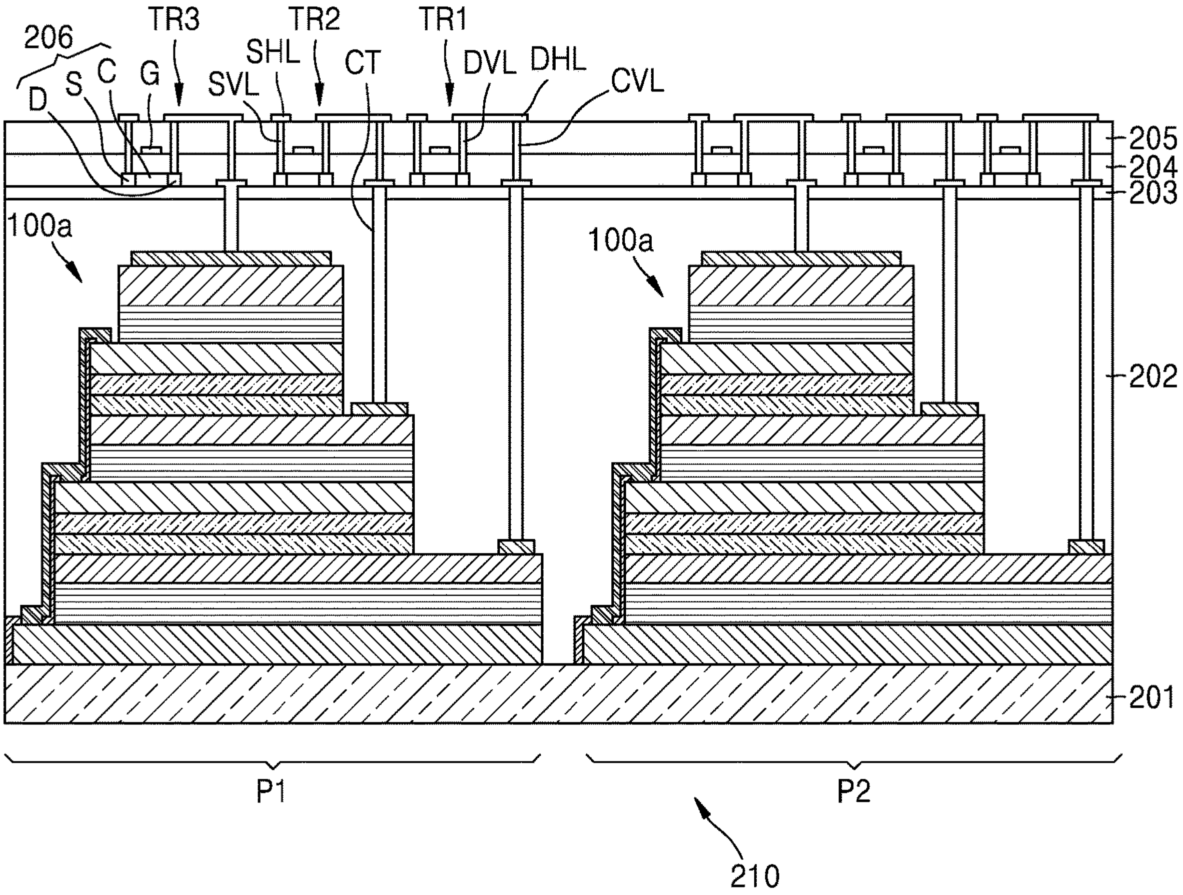
FIG. 7 is a schematic cross-sectional view illustrating a structure of a pixel array of a display apparatus including the light emitting device illustrated in FIG. 6, according to an embodiment.

FIG. 7 is a schematic cross-sectional view illustrating a structure of a pixel array of a display apparatus including the light emitting device 100*a* illustrated in FIG. 6. Referring to FIG. 7, a pixel array 210 of the display apparatus may include a display substrate 201, a plurality of light emitting devices 100*a* provided on the upper surface of the display substrate 201, and a first insulating layer 202 provided to cover the upper surface of the display substrate 201 and the plurality of light emitting devices 100*a*. The first insulating layer 202 may include, but not be limited to, $SiO_2$, $Al_2O_3$, SiN, AlN, and/or a combination thereof. In an embodiment, a common electrode line electrically connected to the common electrode 115 of the plurality of light emitting devices 100*a* may be provided on the display substrate 201.

Although only two light emitting devices 100*a* are illustrated in FIG. 7 for simplicity, a large number of light emitting devices 100*a* may be provided in the form of a two-dimensional matrix on the display substrate 201. Each light emitting device 100*a* may have a structure as illustrated in FIG. 6 and may form one of a plurality of pixels (e.g., P1 and P2) of the pixel array 210. In other words, each of the plurality of pixels (e.g., P1 and P2) may include the light emitting device 100*a* illustrated in FIG. 6.

The pixel array 210 of the display apparatus may further include a plurality of transistors (e.g., TR1, TR2, and TR3) for independently driving the first light emitting element 110, the second light emitting element 130, and the third light emitting element 150 of each light emitting device 100*a*. For example, the pixel array 210 of the display apparatus may include the first transistor TR1, the second transistor TR2, and the third transistor TR3 provided with respect to each light emitting device 100*a*. In an embodiment, the first transistor TR1, the second transistor TR2, and the third transistor TR3 may be provided on the first insulating layer 202.

The first transistor TR1 may be configured to drive the first light emitting element 110 of the corresponding light emitting device 100*a*, the second transistor TR2 may be configured to drive the second light emitting element 130 of the corresponding light emitting device 100*a*, and the third transistor TR3 may be configured to drive the third light emitting element 150 of the corresponding light emitting device 100*a*.

The pixel array 210 of the display apparatus may further include a buffer layer 203 provided on the upper surface of the first insulating layer 202 to form the plurality of first to third transistors TR1 to TR3. A plurality of semiconductor patterns 206 of the first to third transistors TR1 to TR3 may be formed on the upper surface of the buffer layer 203. Each of the plurality of semiconductor patterns 206 may include a source region S, a drain region D, and a channel region C. The plurality of semiconductor patterns 206 may be formed by forming amorphous semiconductor patterns on the buffer layer 203 and radiating a laser to either end of each of the amorphous semiconductor patterns to be crystallized. For example, amorphous semiconductor patterns may include, but not be limited to, amorphous silicon.

The pixel array 210 of the display apparatus may further include a second insulating layer 204 provided to cover an upper surface of the buffer layer 203 and the plurality of semiconductor patterns 206. For example, the second insulating layer 204 may include, but not be limited to, $SiO_2$, $Al_2O_3$, SiN, AlN, and/or a combination thereof. In an embodiment, the second insulating layer 204 may function as a gate insulating layer.

A plurality of gate electrodes G may be formed, according to an embodiment, on the second insulating layer 204. Each of the gate electrodes G may be provided to face the corresponding channel region C in the vertical direction. Each gate electrode G may include, for example, a conductive material, such as metal or polysilicon. Each of the semiconductor patterns 206, the second insulating layer 204, and each of the gate electrodes G may form one of the first to third transistors TR1 to TR3. Each of a plurality of gate electrodes G may be electrically connected to scan lines as described with reference to FIG. 8.

The pixel array 210 of the display apparatus may further include a third insulating layer 205 provided to cover the upper surface of the second insulating layer 204 and the plurality of gate electrodes G. For example, the third insulating layer 205 may include, but not be limited to, $SiO_2$, $Al_2O_3$, SiN, AlN, and/or a combination thereof.

The pixel array 210 of the display apparatus may include a buffer layer 203 and a plurality of contacts CT passing through the first insulating layer 202 in the vertical direction. Each of the plurality of contacts CT may vertically pass through the buffer layer 203 and the first insulating layer 202 to be electrically connected to one of the first electrode 114 of the first light emitting element 110, the second electrode 134 of the second light emitting element 130, and the third electrode 154 of the third light emitting element 150. The upper portions of the plurality of contacts CT may be exposed above the upper surface of the buffer layer 203. The plurality of contacts CT may include, for example, a conductive material such as a metal.

The pixel array 210 of the display apparatus may further include a plurality of contact vertical lines CVL, a plurality of source vertical lines SVL, a plurality of drain vertical lines DVL, a plurality of source horizontal lines SHL, and a plurality of drain horizontal lines DHL. The plurality of contact vertical lines CVL, the plurality of source vertical lines SVL, the plurality of drain vertical lines DVL, the plurality of source horizontal lines SHL, and the plurality of drain horizontal lines DHL may include, for example, a conductive material such as metal. Each of the plurality of contact vertical lines CVL may be electrically connected to the corresponding contact CT by passing through the second insulating layer 204 and the third insulating layer 205 in the vertical direction. Each of the plurality of source vertical lines SVL may be electrically connected to the corresponding source region S by passing through the second insulating layer 204 and the third insulating layer 205 in the vertical direction. Each of the plurality of drain vertical lines DVL may be electrically connected to the corresponding drain region D by passing through the second insulating layer 204 and the third insulating layer 205 in the vertical direction. Each of the plurality of source horizontal lines SHL may be electrically connected to the corresponding source vertical line SVL and may extend in the horizontal direction on the upper surface of the third insulating layer 205. Alternatively or additionally, each of the plurality of source horizontal lines SHL may be electrically connected to data lines as described with reference to FIG. 8. Each of the plurality of drain horizontal lines DHL may extend in the horizontal direction on the upper surface of the third insulating layer 205 to electrically connect the drain vertical line DVL and the contact vertical line CVL, which may be adjacent to each other.

Figure 8:
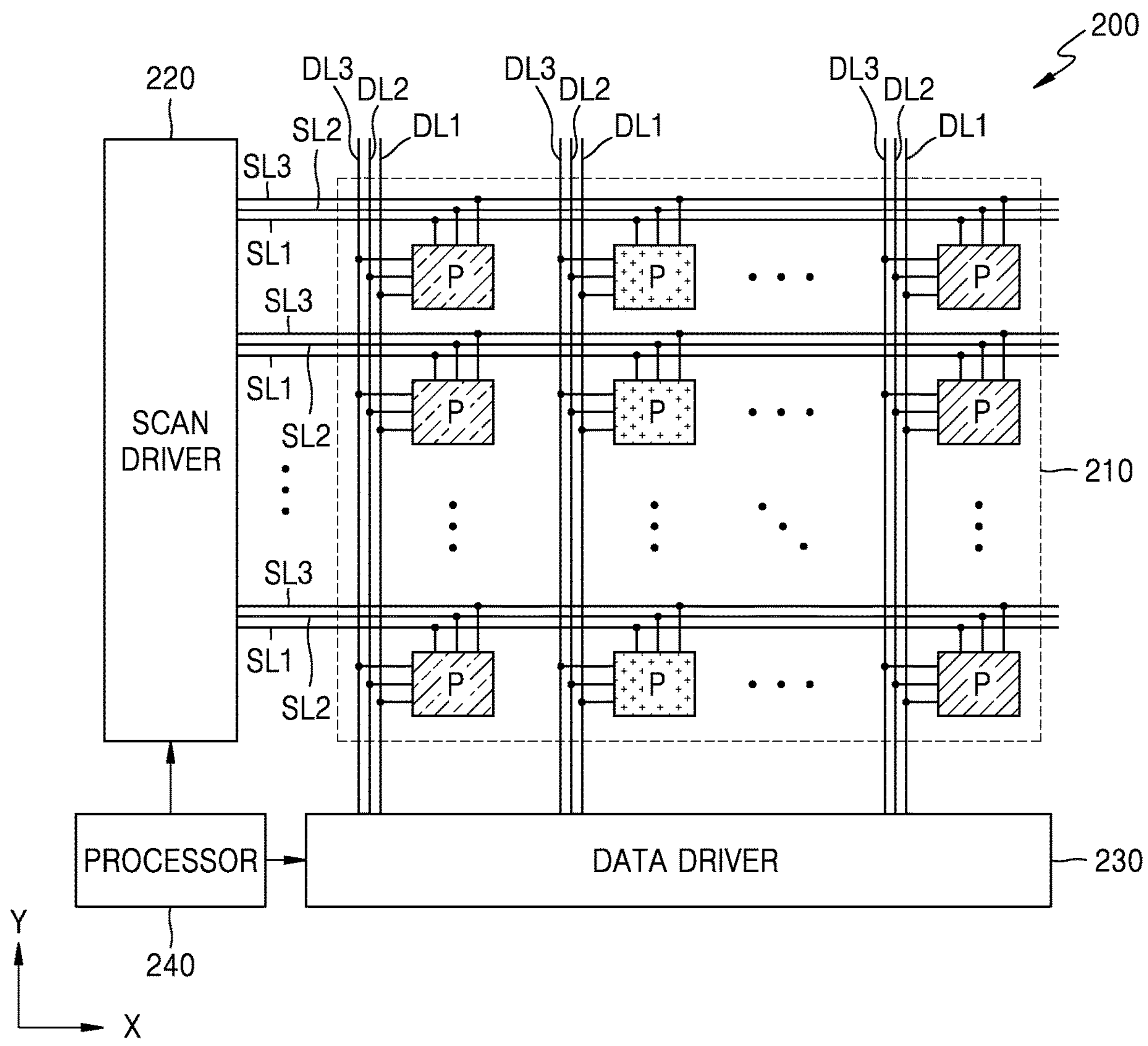
FIG. 8 is a block diagram illustrating a schematic configuration of a display apparatus including the pixel array illustrated in FIG. 7, according to an embodiment.

FIG. 8 is a block diagram illustrating a schematic configuration of a display apparatus including the pixel array 210 illustrated in FIG. 7. Referring to FIG. 8, a display apparatus 200 may include a pixel array 210 configured to emit light to create an image, a scan driver 220 (e.g., a scan driver circuit) configured to sequentially activate rows of pixels in the pixel array 210, a data driver 230 (e.g., a data driver circuit) configured to provide electrical signals to activate individual pixels within each column, and a processor 240 configured to control the scan driver 220 and the data driver 230. The pixel array 210 may include a plurality of pixels P provided in a two-dimensional array form, a plurality of scan line sets that transmit scan signals to the plurality of pixels P, and a plurality of data line sets that transmit data signals to the plurality of pixels P. The plurality of pixels P of the pixel array 210 may have a structure illustrated in FIG. 7.

Each scan line set may include a first scan line SL1, a second scan line SL2, and a third scan line SL3 extending in a first direction (e.g., X direction). Each of the first scan line SL1, the second scan line SL2, and the third scan line SL3 may be connected to the plurality of pixels P provided in the first direction (e.g., X direction). For example, the first scan line SL1 may be electrically connected to the gate electrode G of the first transistor TR1 in each pixel P, the second scan line SL2 may be electrically connected to the gate electrode G of the second transistor TR2 in each pixel P, and the third scan line SL3 may be electrically connected to the gate electrode G of the third transistor TR3 in each pixel P. The first scan line SL1, the second scan line SL2, and the third scan line SL3 may also be connected to the scan driver 220 to receive the scan signals from the scan driver 220, respectively.

Each data line set may include a first data line DL1, a second data line DL2, and a third data line DL3, which may extend in a second direction (e.g., Y direction). Each of the first data line DL1, the second data line DL2, and the third data line DL3 may be connected to the plurality of pixels P provided along the second direction (e.g., Y direction). For example, the first data line DL1 may be electrically connected to the source horizontal line SHL of the first transistor TR1 in each pixel P, the second data line DL2 may be electrically connected to the source horizontal line SHL of the second transistor TR2 in each pixel P, and the third data line DL3 may be connected to the source horizontal line SHL of the third transistor TR3 in each pixel P. The first data line DL1, the second data line DL2, and the third data line DL3 may also be connected to the data driver 230 to receive data signals from the data driver 230, respectively.

The processor 240 may control the operations of the scan driver 220 and the data driver 230 based on the data of the image to be displayed in the pixel array 210, thereby adjusting the scan signal and the data signal provided to each pixel P.

In the above-described display apparatus 200, one pixel providing all of blue light, green light, and red light with only one light emitting device may be formed. Accordingly, the display apparatus 200 may provide an ultra-high resolution image. The display apparatus 200 may be applied to various electronic devices having a screen display function.

Figure 9:
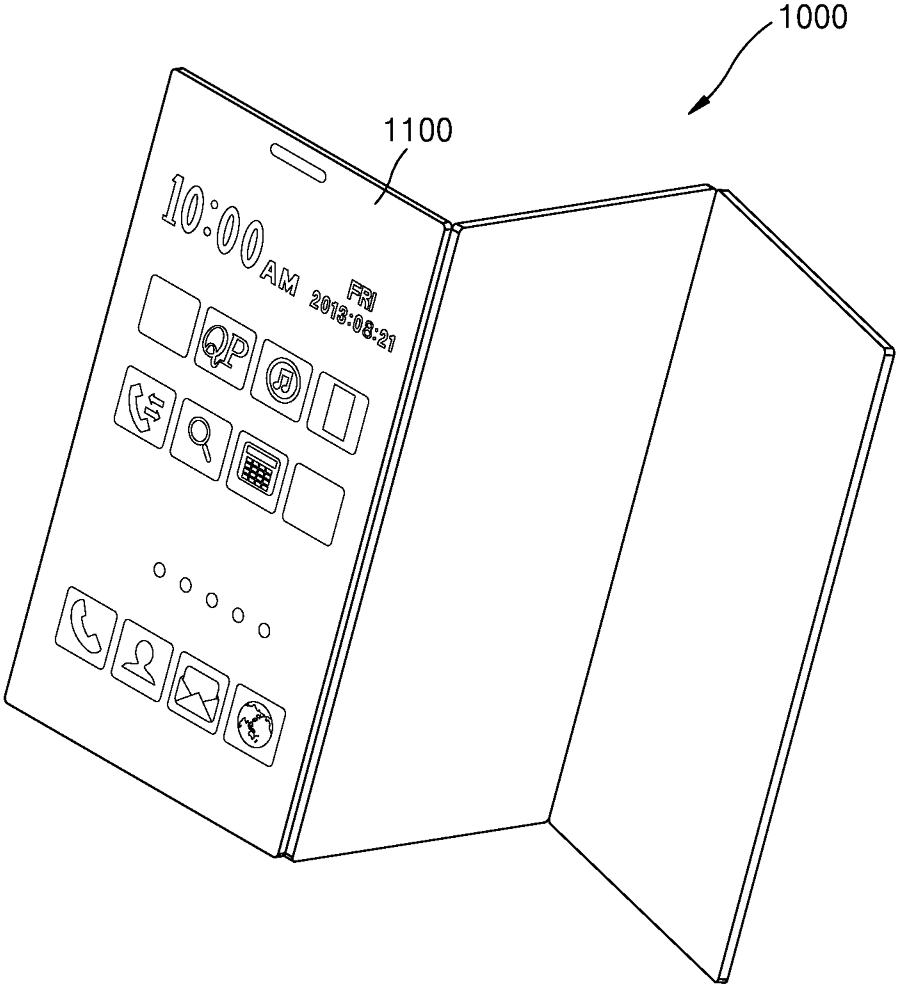
FIG. 9 illustrates an example in which a display apparatus is applied to a mobile apparatus, according to an embodiment.

FIG. 9 illustrates an example in which a display apparatus according to an embodiment is applied to a mobile apparatus 1000. The mobile apparatus 1000 may include a display apparatus 1100. The display apparatus 1100 may include the display apparatus 200 of FIG. 8, according to an embodiment. The display apparatus 1100 may have a foldable structure, and may be implemented as, for example, a multi-folder display. Although the mobile apparatus 1000 includes a folder-type display in FIG. 9, the present disclosure is not limited in this regard, and the mobile apparatus 1000 may have other form factors. For example, the mobile apparatus 1000 may include a flat-panel type display.

Figure 10:
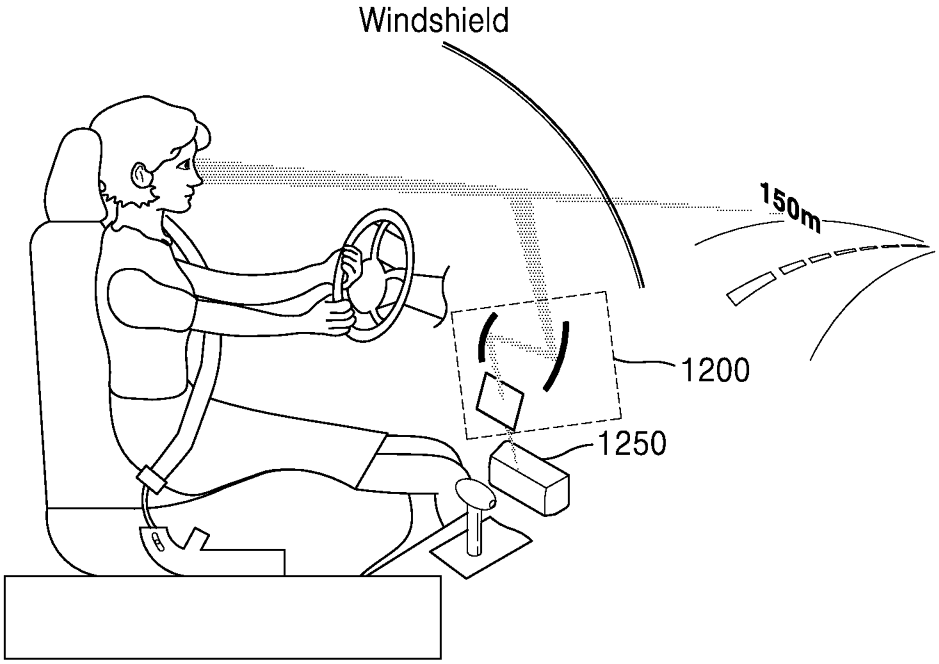
FIG. 10 illustrates an example in which a display apparatus is applied to a display apparatus for a vehicle, according to an embodiment.

FIG. 10 illustrates an example in which a display apparatus according to an embodiment is applied to a vehicle. Referring to FIG. 10, the display apparatus may be implemented as a heads-up display apparatus for a vehicle. The heads-up display apparatus may include a display apparatus 1250 provided in one area of a vehicle and at least one optical path changing member 1200 that may convert a path of light so that a driver may view an image generated by the display apparatus 1250. The display apparatus 1250 may include the display apparatus 200, according to an embodiment.

Figure 11:
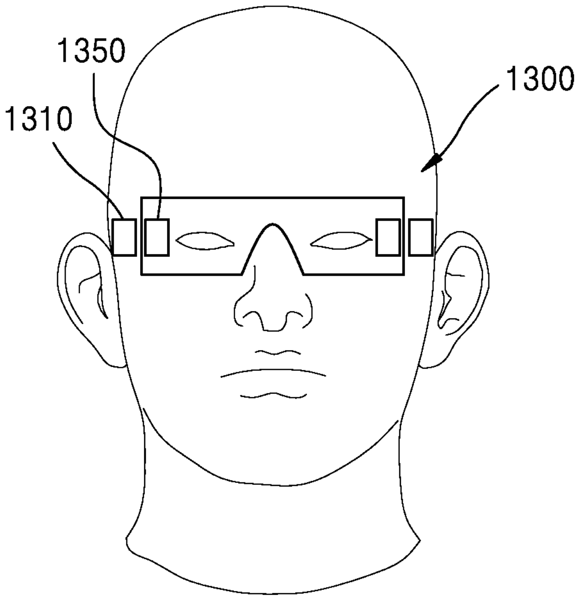
FIG. 11 illustrates an example in which a display apparatus is applied to augmented reality glasses or virtual reality glasses. according to an embodiment.

FIG. 11 illustrates an example in which a display apparatus, according to an embodiment, is applied to augmented reality glasses and/or virtual reality glasses. The augmented reality glasses 1300 may include a projection system 1310 configured to form an image, and at least one element 1350 configured to guide an image from the projection system 1310 to enter the user's eye. The projection system 1310 may include the display apparatus 200, according to an embodiment.

Figure 12:
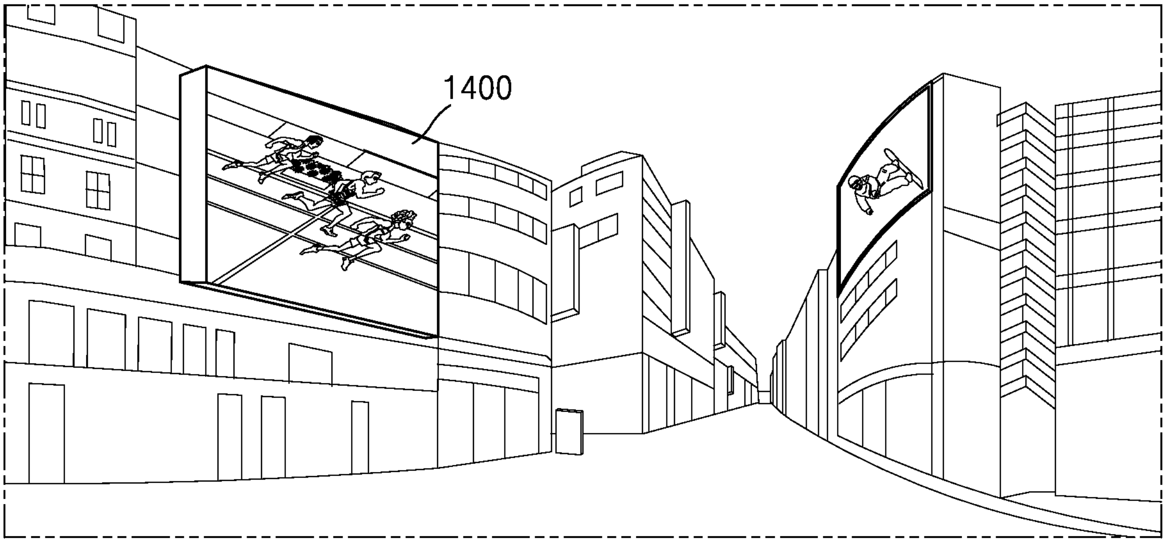
FIG. 12 illustrates an example in which a display apparatus is applied to a signage, according to an embodiment.

FIG. 12 illustrates an example in which a display apparatus, according to an embodiment, is applied to a large signage. The signage 1400 may be used for outdoor advertising using a digital information display, and may control advertising content, etc. through a communication network. The signage 1400 may be implemented by adopting, for example, the display apparatus 200, according to an embodiment.

Figure 13:
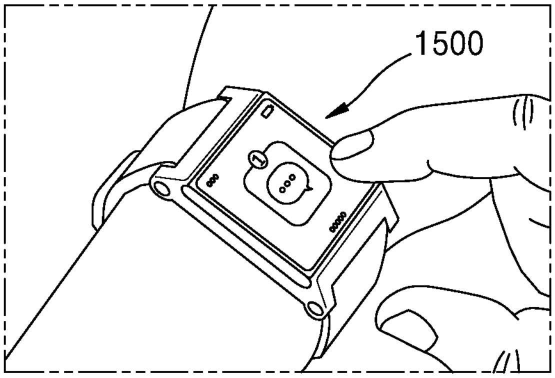
FIG. 13 illustrates an example in which a display apparatus is applied to a wearable display, according to an embodiment.

FIG. 13 illustrates an example in which a display apparatus, according to an embodiment, is applied to a display of a wearable apparatus. The display 1500 of the wearable apparatus may be implemented by adopting the display apparatus 200, according to an embodiment.

The display apparatus 200, according to an embodiment, may be applied to various products such as, but not be limited to, a rollable television (TV), a stretchable display, and the like.

It should be understood that embodiments described here should be considered in a descriptive sense only and not for permissions of limitation, although the above-described light emitting device and display apparatus including the same have been described with reference to the embodiment shown in the drawings. Descriptions of features or aspects within each embodiment should typically be considered as available for other similar features or aspects in other embodiments. While one or more embodiments have been described with reference to the figures, it is to be understood by those of ordinary skill in the art that various changes in form and details may be made therein without departing from the spirit and scope as defined by the following claims.

What is claimed is:

1. A light emitting device, comprising:
a first light emitting element configured to emit light of a first wavelength;
a PN junction layer provided on the first light emitting element; and
a second light emitting element provided on the PN junction layer and configured to emit light of a second wavelength different from the first wavelength,
wherein the PN junction layer comprises:
a first conductivity type semiconductor layer provided on the first light emitting element and doped with impurities of a first conductivity type; and
a second conductivity type semiconductor layer provided on the first conductivity type semiconductor layer and doped with impurities of a second conductivity type electrically opposite to the first conductivity type,
wherein each of the first light emitting element and the second light emitting element comprises:
a first semiconductor layer;
a second semiconductor layer; and
an active layer provided between the first semiconductor layer and the second semiconductor layer,
wherein the first conductivity type semiconductor layer contacts an upper surface of the second semiconductor layer of the first light emitting element,
wherein the first semiconductor layer of the second light emitting element contacts an upper surface of the second conductivity type semiconductor layer,
wherein the first semiconductor layer of the first light emitting element and the first semiconductor layer of the second light emitting element are doped with impurities of the first conductivity type, and
wherein the second semiconductor layer of the first light emitting element and the second semiconductor layer of the second light emitting element are doped with impurities of the second conductivity type.

2. The light emitting device of claim 1, wherein a first thickness of the first conductivity type semiconductor layer and a second thickness of the second conductivity type semiconductor layer are each about 1 nanometer (nm) or more and about 1 micrometer (μm) or less.

3. The light emitting device of claim 1, wherein each of doping concentrations of the first conductivity type semiconductor layer and the second conductivity type semiconductor layer ranges from $10^{16}/cm^3$ to $10^{20}/cm^3$.

4. The light emitting device of claim 1, wherein:
the first light emitting element, the PN junction layer, and the second light emitting element operate as a first diode, a second diode, and a third diode in an equivalent circuit of the light emitting device,
a cathode of the second diode is coupled to an anode of the first diode,
a cathode of the third diode is coupled to an anode of the second diode,
a common ground is coupled to a cathode of the first diode, the anode of the second diode, and the cathode of the third diode, and
an individual driving voltage line is coupled to each of the anode of the first diode and the anode of the third diode.

5. The light emitting device of claim 4, wherein:
the active layer of the first light emitting element and the active layer of the second light emitting element comprise a nitride semiconductor material containing indium (In), and
an indium content in the active layer of the first light emitting element is less than an indium content in the active layer of the second light emitting element.

6. The light emitting device of claim 1, wherein:
the PN junction layer provided on the first light emitting element is a first PN junction layer, and
the light emitting device further comprises:
a second PN junction layer provided on the second light emitting element; and
a third light emitting element provided on the second PN junction layer and configured to emit light of a third wavelength different from the first wavelength and the second wavelength, and
the second PN junction layer comprises:
a first conductivity type semiconductor layer provided on the second light emitting element and doped with impurities of the first conductivity type; and
a second conductivity type semiconductor layer provided on the first conductivity type semiconductor layer of the second PN junction layer and doped with impurities of the second conductivity type.

7. The light emitting device of claim 6, wherein:
the third light emitting element comprises:
a first semiconductor layer;
a second semiconductor layer; and
an active layer provided between the first semiconductor layer and the second semiconductor layer.

8. The light emitting device of claim 7, wherein:
the first conductivity type semiconductor layer of the second PN junction layer is provided on an upper surface of the second semiconductor layer of the second light emitting element, and
the first semiconductor layer of the third light emitting element is provided on an upper surface of the second conductivity type semiconductor layer of the second PN junction layer.

9. The light emitting device of claim 8, wherein:
the first conductivity type semiconductor layer of the first PN junction layer, the first conductivity type semiconductor layer of the second PN junction layer, and the first semiconductor layer of the third light emitting element are doped with impurities of the first conductivity type, and the second conductivity type semiconductor layer of the first PN junction layer, the second conductivity type semiconductor layer of the second PN junction layer, and the second semiconductor layer of the third light emitting element are doped with impurities of the second conductivity type.

10. The light emitting device of claim 9, wherein:

the first light emitting element, the first PN junction layer, the second light emitting element, the second PN junction layer, and the third light emitting element operate as a first diode, a second diode, a third diode, a fourth diode, and a fifth diode in an equivalent circuit of the light emitting device, a cathode of the second diode is coupled to an anode of the first diode, a cathode of the third diode is coupled to an anode of the second diode, a cathode of the fourth diode is coupled to an anode of the third diode, a cathode of the fifth diode is coupled to an anode of the fourth diode, a common ground is coupled to the cathode of the first diode, the anode of the second diode, the cathode of the third diode, the anode of the fourth diode, and the cathode of the fifth diode, and an individual driving voltage line is coupled to each of the anode of the first diode, the anode of the third diode, and the anode of the fifth diode.

11. The light emitting device of claim 8, wherein:

the active layer of the first light emitting element, the active layer of the second light emitting element, and the active layer of the third light emitting element each comprise a nitride semiconductor material including indium (In), an indium content in the active layer of the first light emitting element is less than an indium content in the active layer of the second light emitting element, and an indium content in the active layer of the second light emitting element is less than an indium content in the active layer of the third light emitting element.

12. The light emitting device of claim 8, wherein:

a first edge region of the upper surface of the first semiconductor layer of the first light emitting element, a first edge region of the upper surface of the first semiconductor layer of the second light emitting element, a first edge region of the upper surface of the first semiconductor layer of the third light emitting element are exposed, a second edge region of the upper surface of the second semiconductor layer of the first light emitting element, and a second edge region of the upper surface of the second semiconductor layer of the second light emitting element are exposed, and the light emitting device further comprises:

- a first electrode provided in the second edge region of the upper surface of the second semiconductor layer of the first light emitting element;
- a second electrode provided in the second edge region of the upper surface of the second semiconductor layer of the second light emitting element;
- a third electrode provided on the upper surface of the second semiconductor layer of the third light emitting element; and
- a common electrode integrally provided in the first edge region of the upper surface of the first semiconductor layer of the first light emitting element, the first edge region of the upper surface of the first semiconductor layer of the second light emitting element, and the first edge region of the upper surface of the first semiconductor layer of the third light emitting element.

13. The light emitting device of claim 12, wherein:

a first side surface of the active layer of the first light emitting element, a first side surface of the second semiconductor layer of the first light emitting element, a first side surface of the first conductivity type semiconductor layer of the first PN junction layer, a first side surface of the second conductivity type semiconductor layer of the first PN junction layer, and a first side surface of the first semiconductor layer of the second light emitting element form a first plane continuously extending in a vertical direction, a first side surface of the active layer of the second light emitting element, a first side surface of the second semiconductor layer of the second light emitting element, a first side surface of the second conductivity type semiconductor layer of the second PN junction layer, a first side surface of the second conductivity type semiconductor layer of the second PN junction layer, and a first side surface of the first semiconductor layer of the third light emitting element form a second plane continuously extending in the vertical direction, and the light emitting device further comprises an insulating layer extending in the vertical direction along each of the first plane and the second plane.

14. The light emitting device of claim 13, wherein:

the common electrode integrally extends along the first edge region of the upper surface of the first semiconductor layer of the first light emitting element, the insulating layer on the first plane, the first edge region of the upper surface of the first semiconductor layer of the second light emitting element, the insulating layer on the second plane, and the first edge region of the upper surface of the first semiconductor layer of the third light emitting element.

15. A display apparatus, comprising:

a first light emitting device (LED), a second LED, and a third LED that are stacked in a vertical direction and configured to emit light of different wavelengths;

a first PN junction layer provided between the first LED and the second LED; and a second PN junction layer provided between the second LED and the third LED, wherein two opposing edge regions on an upper surface of each of the first LED, the second LED, and the third LED are etched away to be exposed, and wherein each of the first LED, the second LED, and the third LED comprises:

- a first nitride semiconductor material and a second nitride semiconductor material with opposite conductivity types;
- an active layer configured to emit light and provided between the first light emitting element and the second nitride semiconductor material in the vertical direction;
- a common n-type electrode provided on one of the two opposing edge regions on the upper surface of each of the first LED, the second LED, and the third LED; and a plurality of p-type electrodes provided on another one of the two opposing edge regions on the upper surface of each of the first LED, the second LED, and the third LED, wherein each of the first PN junction layer and the second PN junction layer comprises a first conductivity type semiconductor layer and a second conductivity type semiconductor layer with opposite conductivity types, wherein the first conductivity type semiconductor layer of the first PN junction layer and the second nitride semiconductor material of the first LED contact each other and have conductive types opposite to each other, wherein the second conductivity type semiconductor layer of the first PN junction layer and the first nitride semiconductor material of the second LED contact each other and have conductive types opposite to each other, wherein the first conductivity type semiconductor layer of the second PN junction layer and the second nitride semiconductor material of the second LED contact each other and have conductive types opposite to each other, and wherein the second conductivity type semiconductor layer of the second PN junction layer and the first nitride semiconductor material of the third LED contact each other and have conductive types opposite to each other.

16. A display apparatus, comprising:

a pixel array including a plurality of pixels provided in a two-dimensional array;

a scan driving circuit for providing a scan signal;

a data driving circuit for providing a data signal; and a processor configured to control operations of the scan driving circuit and the data driving circuit, wherein each of the plurality of pixels in the pixel array comprises:

a first light emitting element configured to emit light of a first wavelength;

a PN junction layer provided on the first light emitting element; and a second light emitting element provided on the PN junction layer and configured to emit light of a second wavelength different from the first wavelength, wherein the PN junction layer comprises:

a first conductivity type semiconductor layer provided on the first light emitting element and doped with impurities of a first conductivity type; and a second conductivity type semiconductor layer provided on the first conductivity type semiconductor layer and doped with impurities of a second conductivity type electrically opposite to the first conductivity type, wherein each of the first light emitting element and the second light emitting element comprises:

a first semiconductor layer;

a second semiconductor layer; and an active layer provided between the first semiconductor layer and the second semiconductor layer, wherein the first conductivity type semiconductor layer contacts an upper surface of the second semiconductor layer of the first light emitting element, wherein the first semiconductor layer of the second light emitting element contacts on an upper surface of the second conductivity type semiconductor layer, wherein the first semiconductor layer of the first light emitting element and the first semiconductor layer of the second light emitting element are doped with impurities of the first conductivity type, and wherein the second semiconductor layer of the first light emitting element and the second semiconductor layer of the second light emitting element are doped with impurities of the second conductivity type.

* * * * *